(12) United States Patent
Wang et al.

(10) Patent No.: US 12,232,389 B2
(45) Date of Patent: Feb. 18, 2025

(54) PIXEL STRUCTURE, DISPLAY PANEL, AND DISPLAY DEVICE

(71) Applicant: JITRI INSTITUTE OF ORGANIC OPTOELECTRONICS CO., LTD., Lili Town (CN)

(72) Inventors: Xuliang Wang, Lili Town (CN); Kai Zhu, Lili Town (CN); Hao Wang, Lili Town (CN); Jian Liang, Lili Town (CN); Xiaozhao Zhu, Lili Town (HK); Chaogan Cao, Lili Town (CN)

(73) Assignee: JITRI INSTITUTE OF ORGANIC OPTOELECTRONICS CO., LTD. (CN)

( * ) Notice: Subject to any disclaimer, the term of this patent is extended or adjusted under 35 U.S.C. 154(b) by 490 days.

(21) Appl. No.: 17/614,995

(22) PCT Filed: Apr. 17, 2020

(86) PCT No.: PCT/CN2020/085360
§ 371 (c)(1),
(2) Date: Nov. 29, 2021

(87) PCT Pub. No.: WO2020/238465
PCT Pub. Date: Dec. 3, 2020

(65) Prior Publication Data
US 2022/0238609 A1 Jul. 28, 2022

(30) Foreign Application Priority Data

May 29, 2019 (CN) .......................... 201910458249.X
May 29, 2019 (CN) .......................... 201910459235.X

(51) Int. Cl.
*H10K 59/35* (2023.01)
*H10K 59/122* (2023.01)

(52) U.S. Cl.
CPC ......... *H10K 59/352* (2023.02); *H10K 59/122* (2023.02); *H10K 59/351* (2023.02)

(58) Field of Classification Search
CPC ....... H10K 59/351–353; H10K 59/122; H10K 59/131; H10K 59/1315; H10K 59/19; H10K 59/35
See application file for complete search history.

(56) References Cited

U.S. PATENT DOCUMENTS 9,391,121 B2   7/2016 Lee et al.
2016/0329385 A1* 11/2016 Qiu ...................... H10K 59/352
(Continued)

FOREIGN PATENT DOCUMENTS

CN    103887320 A    6/2014
CN    105006479 A    10/2015
(Continued)

OTHER PUBLICATIONS

Chinese Application No. 201910458249.X, First Chinese Office Action mailed Oct. 10, 2020, 14 pages.
(Continued)

*Primary Examiner* — Eric K Ashbahian
*Assistant Examiner* — David W Ward
(74) *Attorney, Agent, or Firm* — McDonald Hopkins LLC

(57) ABSTRACT

Provided are a pixel structure, a display panel and a display device. The pixel structure includes multiple first sub-pixel groups, each of the multiple first sub-pixel groups includes a first sub-pixel and at least one second sub-pixel, the first sub-pixel is disposed around the at least one second sub-pixel and an emission color of the first sub-pixel is different from an emission color of any one of the at least one second sub-pixel.

9 Claims, 35 Drawing Sheets

(56) References Cited

U.S. PATENT DOCUMENTS

| | | | | |
|---|---|---|---|---|
| 2020/0058245 A1* | 2/2020 | Cui | ...................... | H10K 59/352 |
| 2020/0321407 A1* | 10/2020 | Tang | ...................... | H10K 71/00 |
| 2020/0403042 A1* | 12/2020 | Liu | ...................... | H10K 71/166 |

FOREIGN PATENT DOCUMENTS

| | | | |
|---|---|---|---|
| CN | 107204358 A | 9/2017 | |
| CN | 110164325 A | 8/2019 | |
| CN | 110211996 A | 9/2019 | |

OTHER PUBLICATIONS

International Application No. PCT/CN2020/085360, International Search Report mailed Dec. 3, 2020, 4 pages.
Chinese Application No. 201910458249.X, First Search of Chinese Application, 1 page.
Chinese Application No. 201910459235.X, First Search of Chinese Application, 1 page.

\* cited by examiner

PIXEL STRUCTURE, DISPLAY PANEL, AND DISPLAY DEVICE

This is a National stage application, filed under 37 U.S.C. 371, of International Patent Application No. PCT/CN2020/085360, filed on Apr. 17, 2020, which is based on and claims priority to Chinese Patent Application No. 201910459235.X filed with the CNIPA on May 29, 2019 and Chinese Patent Application No. 201910458249.X filed with the CNIPA on May 29, 2019, the disclosures of which are incorporated herein by reference in their entireties.

TECHNICAL FIELD

The present disclosure relates to the field of display technology and, in particular, to a pixel structure, a display panel and a display device.

BACKGROUND

Organic light-emitting display devices have advantages of self-luminescence, no backlight, low power consumption, high brightness and the like, which are favored by users.

In the related art, a pixel structure of the organic light-emitting display device includes a standard arrangement mode, a triangular arrangement mode and the like. In the above pixel arrangement modes, sub-pixels of different colors are juxtaposed, so that a distance between light-emitting centers of the sub-pixels of different colors is relatively large, thereby affecting color mixture of light of different colors and resulting in poor display effect of the display device. To solve the above problem, a pixel structure is provided. In this pixel structure, the sub-pixels of different colors constitute a nested structure, and the organic light-emitting display device generally includes sub-pixels of three different colors. After adopting the above nested structure, the sub-pixels of three different colors are nested, so that the outermost sub-pixel has a small width on the premise of ensuring an area ratio of the sub-pixels, and a process implementation area of this sub-pixel is small, causing an increased difficulty in preparing the organic light-emitting display device.

SUMMARY

The present disclosure provides a pixel structure, a display panel and a display device to improve the display effect of the display device and reduce the preparation difficulty of the display device.

The present disclosure provides a pixel structure. The pixel structure includes multiple first sub-pixel groups, each of the multiple first sub-pixel groups includes a first sub-pixel and at least one second sub-pixel, the first sub-pixel is disposed around the at least one second sub-pixel, and an emission color of the first sub-pixel is different from an emission color of any one of the at least one second sub-pixel.

The present disclosure also provides a display panel. The display panel includes the pixel structure described above.

The present disclosure also provides a display device. The display device includes the display panel described above.

DETAILED DESCRIPTION

Implementations, structures, features and effects of a pixel structure, a display panel and a display device provided by the present disclosure are described below with reference to the drawings and embodiments.

Figure 1:
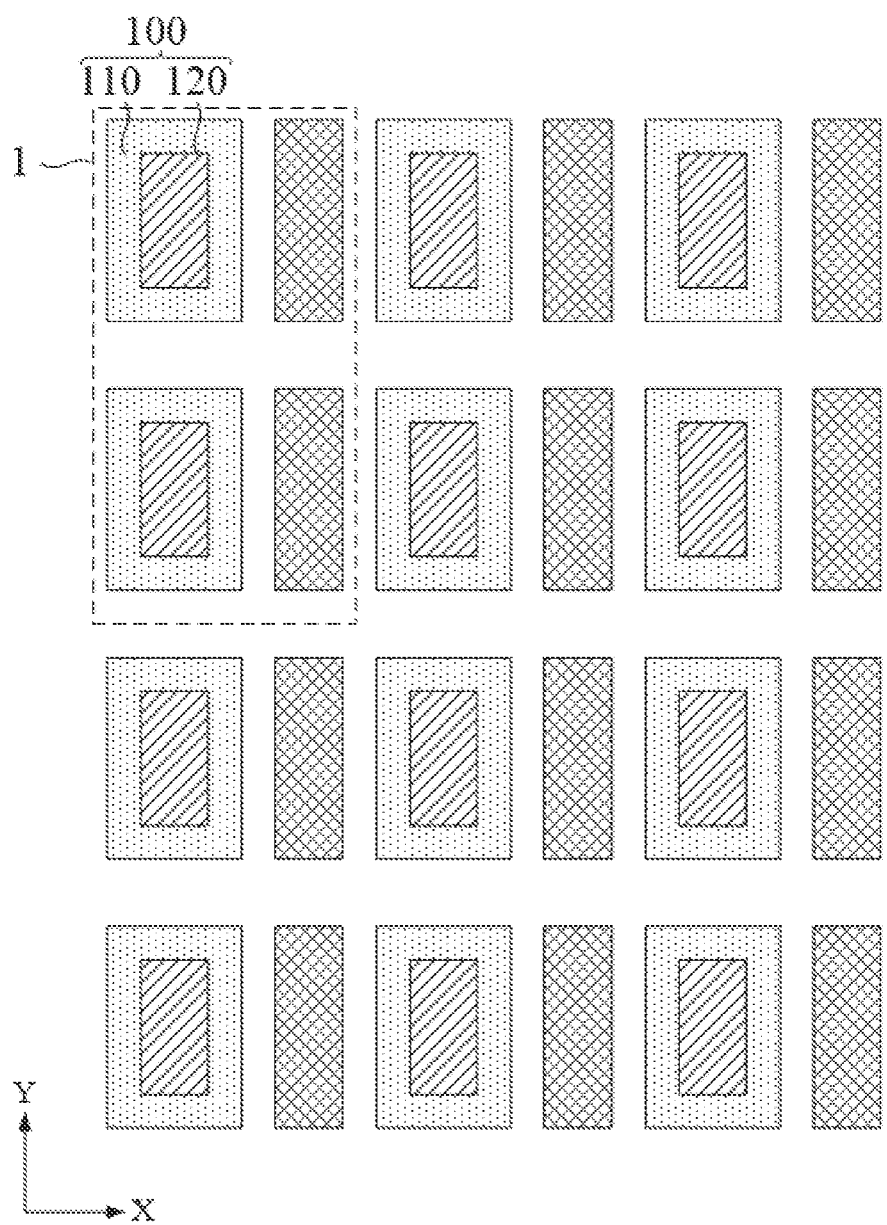
FIG. 1 is a schematic diagram of a pixel structure provided by an embodiment of the present disclosure.

FIG. 1 is a schematic diagram of a pixel structure provided by an embodiment of the present disclosure. As shown in FIG. 1, the pixel structure includes multiple first sub-pixel groups 100. Each of the multiple first sub-pixel groups 100 includes a first sub-pixel 110 and at least one second sub-pixel 120. The first sub-pixel 110 is disposed around the at least one second sub-pixel 120, and an emission color of the first sub-pixel 110 is different from an emission color of any second sub-pixel 120.

The pixel structure provided by the embodiment of the present disclosure includes multiple first sub-pixel groups, each of the multiple first sub-pixel groups includes a first sub-pixel and at least one second sub-pixel, the first sub-pixel is disposed around the at least one second sub-pixel, and an emission color of the first sub-pixel is different from an emission color of any one of the at least one second sub-pixel, so that sub-pixels of different emission colors are in a nested relationship, which facilitates color mixture of light of different colors emitted by the multiple sub-pixels during the display process, and further improves the display effect of the display device. In addition, in the above nested relationship, the sub-pixel at a periphery has a relatively large width, and thus a process implementation area of this sub-pixel is relatively large, which facilitates reducing the preparation difficulty of the display device.

The present disclosure is described in conjunction with the drawings. In a case of describing the embodiments of the present disclosure, for ease of description, schematic diagrams illustrating structures of devices and components are not partially enlarged to a general proportional scale.

The schematic diagrams are merely illustrative and are not intended to limit the scope of the present disclosure. In addition, the actual manufacturing includes three-dimension spatial sizes: length, width and height. An embodiment of the present disclosure further provides a pixel structure. The pixel structure includes at least multiple first sub-pixel groups, each of the multiple first sub-pixel groups includes a first sub-pixel and at least one second sub-pixel, the first sub-pixel is disposed around the at least one second sub-pixel, an emission color of the first sub-pixel is a first color, and an emission color the at least one second sub-pixel is a second color.

The pixel structure provided by the embodiment of the present disclosure includes at least multiple first sub-pixel groups, each of the multiple first sub-pixel groups includes the first sub-pixel and at least one second sub-pixel, the first sub-pixel is disposed around the at least one second sub-pixel, the emission color of the first sub-pixel is the first color, and the emission color of the at least one second sub-pixel is the second color, so that sub-pixels of two different emission colors are in a nested relationship, which facilitates color mixture of light of different colors emitted by the multiple sub-pixels during the display process, and further improves the display effect of the display device. In addition, in the above nested relationship, the sub-pixel at a periphery has a relatively large width, and thus a process implementation area of this sub-pixel is relatively large, which facilitates reducing the preparation difficulty of the display device.

Figure 2:
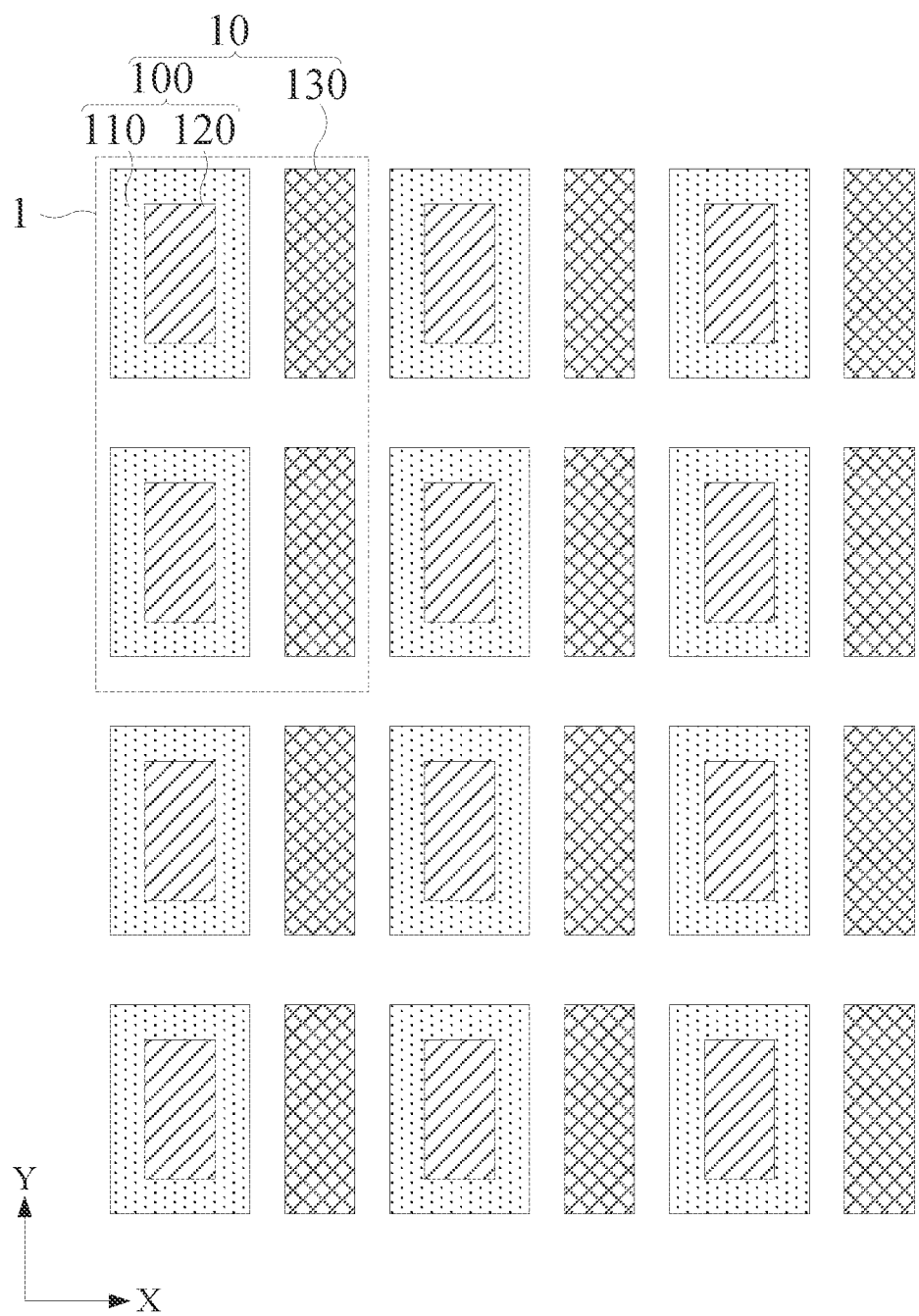
FIG. 2 is a schematic diagram of another pixel structure provided by an embodiment of the present disclosure.

FIG. 2 is a schematic diagram of another pixel structure provided by an embodiment of the present disclosure. As shown in FIG. 2, the pixel structure includes at least multiple first sub-pixel groups 100. Each of the multiple first sub-pixel groups 100 includes a first sub-pixel 110 and at least one second sub-pixel 120. The first sub-pixel 110 is disposed around the at least one second sub-pixel 120, and an emission color of the first sub-pixel 110 is a first color and an emission color of the at least one second sub-pixel 120 is a second color.

Figure 3:
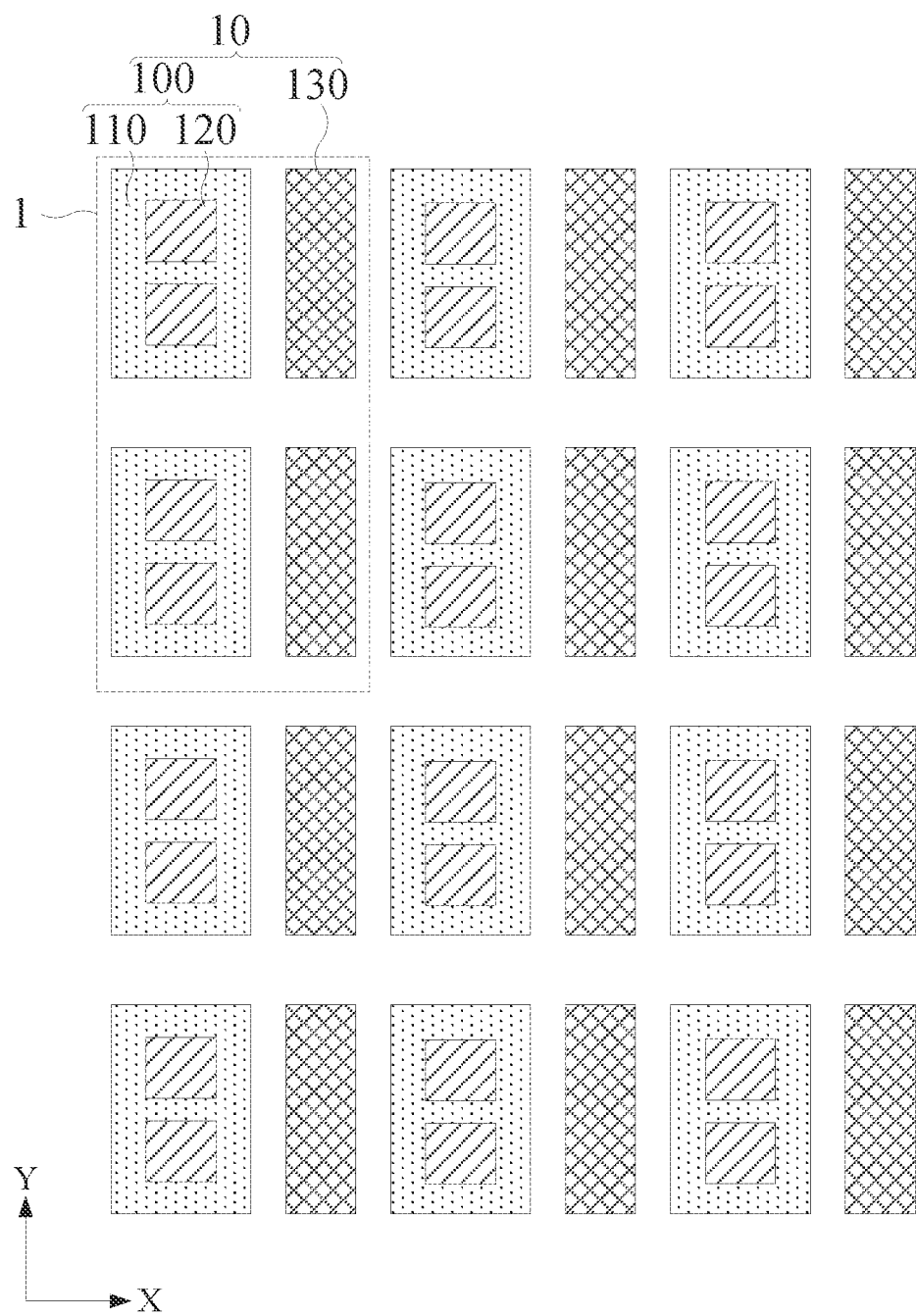
FIG. 3 is a schematic diagram of another pixel structure provided by an embodiment of the present disclosure.

In this embodiment, in FIG. 2, the first sub-pixel group 100 includes one second sub-pixel 120, which is taken as an example for description and is not intended to limit the number of second sub-pixels 120 in the first sub-pixel group 100. In other implementations of this embodiment, the number of second sub-pixels 120 in the first sub-pixel group 100 may be greater than or equal to two. Exemplarily, FIG. 3 is a schematic diagram of another pixel structure provided by an embodiment of the present disclosure. The pixel structure shown in FIG. 3 is similar to the pixel structure shown in FIG. 2 except that the first sub-pixel group 100 in FIG. 3 includes two second sub-pixels 120.

In an embodiment, when the number of second sub-pixels 120 in the first sub-pixel group 100 is greater than or equal to two, the arrangement mode of multiple second sub-pixels 120 in a same first sub-pixel group 100 is not limited in this embodiment. In addition, in this embodiment, other structures in the pixel structure in addition to the first sub-pixel group 100 are not limited. Any solution that satisfies the following condition falls within the scope of this embodiment: in the first sub-pixel group 100, the first sub-pixel 110 is disposed around at least one second sub-pixel 120 and the emission color of the first sub-pixel 110 is different from the emission color of the at least one second sub-pixel 120.

The pixel structure provided by the embodiment of the present disclosure at least includes multiple first sub-pixel groups 100, each of the multiple first sub-pixel groups 100 includes the first sub-pixel 110 and at least one second sub-pixel 120, the first sub-pixel 110 is disposed around the at least one second sub-pixel 120, the emission color of the first sub-pixel 110 is a first color, and the emission color of the second sub-pixel is a second color, so that sub-pixels of two different emission colors are in a nested relationship, which facilitates color mixture of light of different colors emitted by the multiple sub-pixels during the display process, and further improves the display effect of the display device. In addition, in the above nested relationship, the sub-pixel at a periphery has a relatively large width, and thus a process implementation area of this sub-pixel is relatively large, which facilitates reducing the preparation difficulty of the display device.

Exemplarily, referring to FIG. 2, the pixel structure further includes multiple third sub-pixels 130, where an emission color of the multiple third sub-pixels 130 is a third color; and in a first direction X, one first sub-pixel group 100 and one third sub-pixel 130 adjacent to the one first sub-pixel group 100 constitute one pixel unit 10, and multiple pixel units 10 are arranged in an array.

In this embodiment, the first sub-pixel 110, the second sub-pixel 120 and the third sub-pixel 130 have different emission colors, and light of different colors emitted by the first sub-pixel 110, the second sub-pixel 120 and the third sub-pixel 130 are mixed to obtain light of a target color. For example, the light of the target color may be white.

In an embodiment, any one of the first color, the second color and the third color may be one of red, green and blue, and the first color, the second color and the third color are different colors.

In an embodiment, red, green and blue are three primary colors of light, and red, green and blue of different intensities can be mixed to obtain light of multiple colors. Therefore, the above arrangement enables the display device to display various colors and enrich the display color of the display device.

This embodiment does not limit the colors of the first sub-pixel 110, the second sub-pixel 120 and the third sub-pixel 130, and any solution satisfying the above color arrangement falls within the scope of this embodiment.

Exemplarily, the emission color of the first sub-pixel 110 may be red, the light-emitting of the second sub-pixel 120 may be green, and the light-emitting of the third sub-pixel 130 may be blue. An area of the third sub-pixel 130 may be larger than an area of the first sub-pixel 110, and the area of the first sub-pixel 110 may be larger than an area of the second sub-pixel 120. In an embodiment, an area ratio of the first sub-pixel 110, the second sub-pixel 120 and the third sub-pixel 130 may be 10:9:18, thereby achieving a better display effect. The above ratio relationship is merely illustrative and not restrictive. A designer can reasonably adjust the area ratio of the multiple sub-pixels according to actual needs, which is not limited in this embodiment.

In an embodiment, referring to FIG. 2, two adjacent pixel units 10 constitute a pixel unit group 1 in a direction Y vertical to the first direction X, and two pixel units 10 in a same pixel unit group 1 have a same structure.

Figure 4:
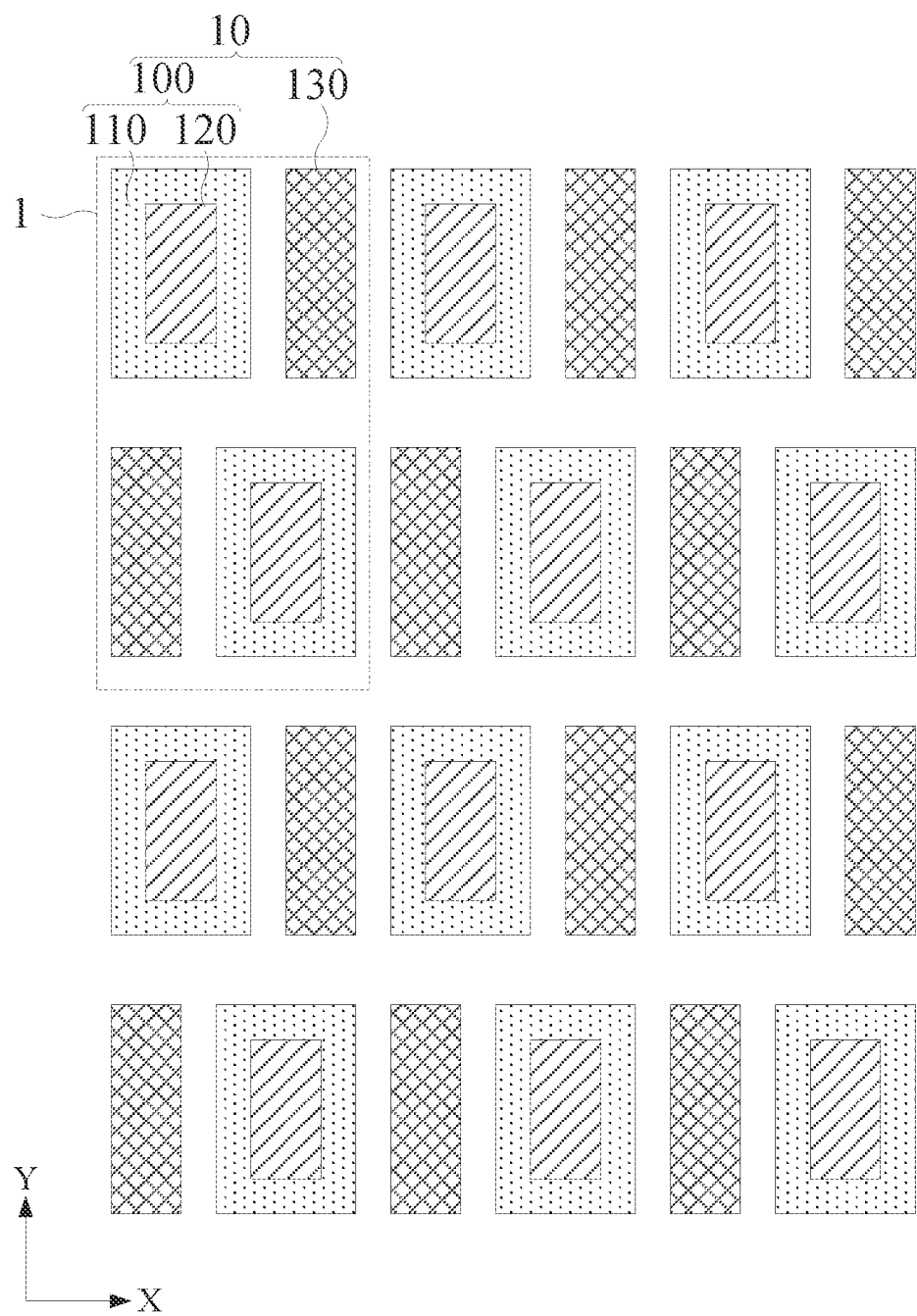
FIG. 4 is a schematic diagram of another pixel structure provided by an embodiment of the present disclosure.

FIG. 4 is a schematic diagram of another pixel structure provided by an embodiment of the present disclosure. As shown in FIG. 4, in a direction Y vertical to a first direction X, two adjacent pixel units 10 constitute a pixel unit group 1, and arrangement orders of a first sub-pixel group 100 and a third sub-pixel 130 in two pixel units 10 in a same pixel unit group 1 are different in the first direction X.

In this embodiment, the pixel unit group 1 is a minimum repeating unit in the pixel structure, and multiple pixel unit groups 1 are repeatedly arranged to constitute the pixel structure.

In an embodiment, as shown in FIG. 4, the arrangement orders being different refers to that the first sub-pixel group 100 and the third sub-pixel 130 in one pixel unit 10 in the pixel unit group 1 are sequentially arranged in the first direction X, and the third sub-pixel 130 and the first sub-pixel group 100 in another pixel unit 10 in the pixel unit group 1 are sequentially arranged in the first direction X. That is, the first sub-pixel groups 100 in the two pixel units 10 in the same pixel unit group 1 have an identical structure, the third sub-pixels 130 in the two pixel units 10 in the same pixel unit group 1 also have an identical structure, and only the arrangement orders of the first sub-pixel group and the third sub-pixel are different.

Such structure shown in FIG. 4 prevents sub-pixels of a same color from being arranged adjacently in the direction Y vertical to the first direction X, thereby reducing the probability of the occurrence of bright lines and facilitating improving the display effect of the display device.

Figure 5:
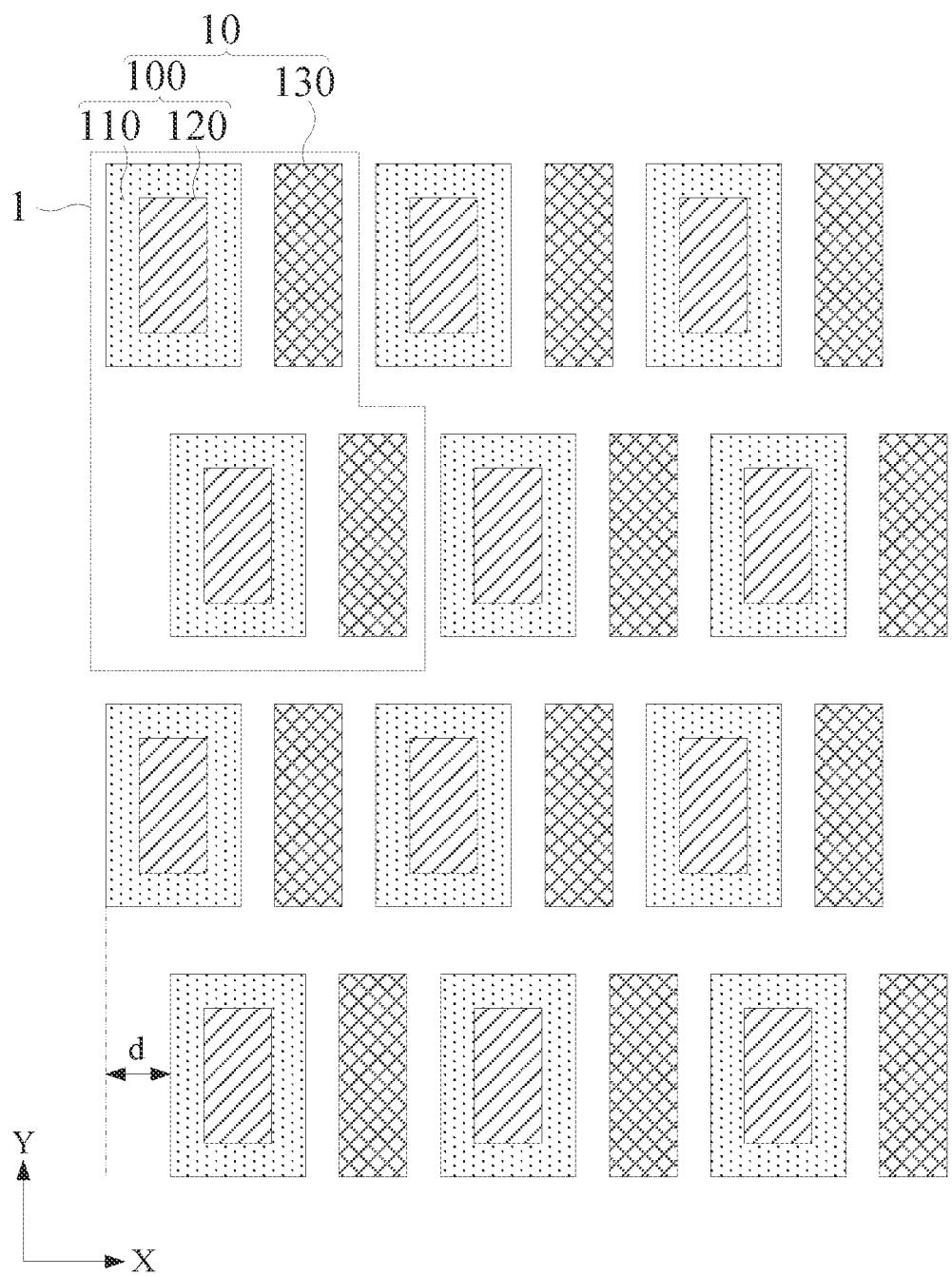
FIG. 5 is a schematic diagram of another pixel structure provided by an embodiment of the present disclosure.
Figure 6:
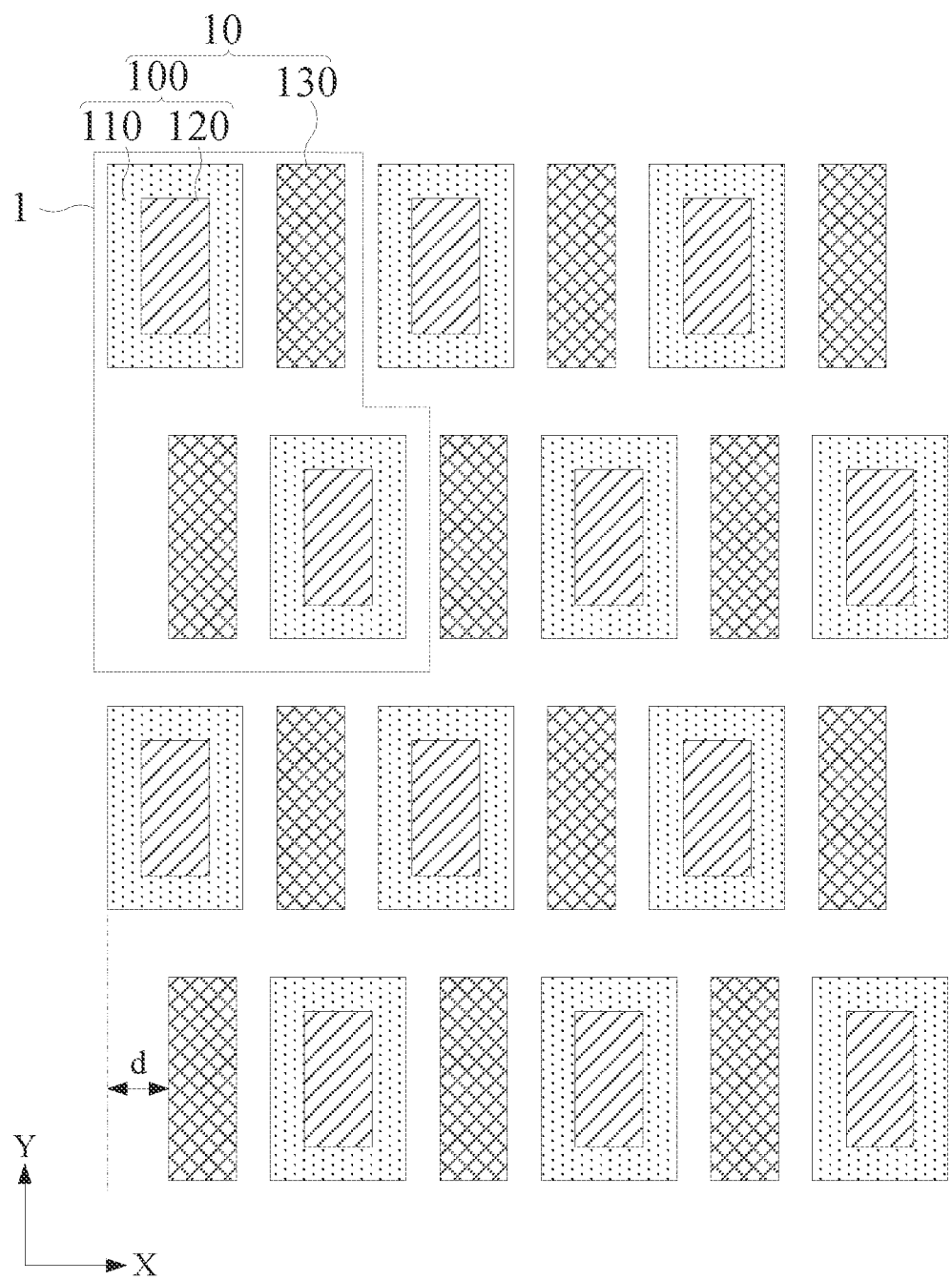
FIG. 6 is a schematic diagram of another pixel structure provided by an embodiment of the present disclosure.

FIG. 5 is a schematic diagram of another pixel structure provided by an embodiment of the present disclosure. FIG. 6 is a schematic diagram of another pixel structure provided by an embodiment of the present disclosure. The pixel structure shown in FIG. 5 is similar to the pixel structure shown in FIG. 2, and the pixel structure shown in FIG. 6 is similar to the pixel structure shown in FIG. 4 except that in FIGS. 5 and 6, two pixel units 10 in a same pixel unit group 1 are misaligned in the first direction X and the misalignment width d is less than a width of a first sub-pixel group 100.

In this embodiment, the misalignment width d refers to a distance between geometric centers of the two pixel units 10 in the same pixel unit group 1 in the first direction X, and the width of the first sub-pixel group 100 refers to a length of the first sub-pixel group 100 in the first direction X.

In this embodiment, such arrangement enables sub-pixels of different emission colors to be more compactly arranged, which facilitates color mixture of light of different colors emitted by multiple sub-pixels and further improves the display effect of the display device.

Figure 7:
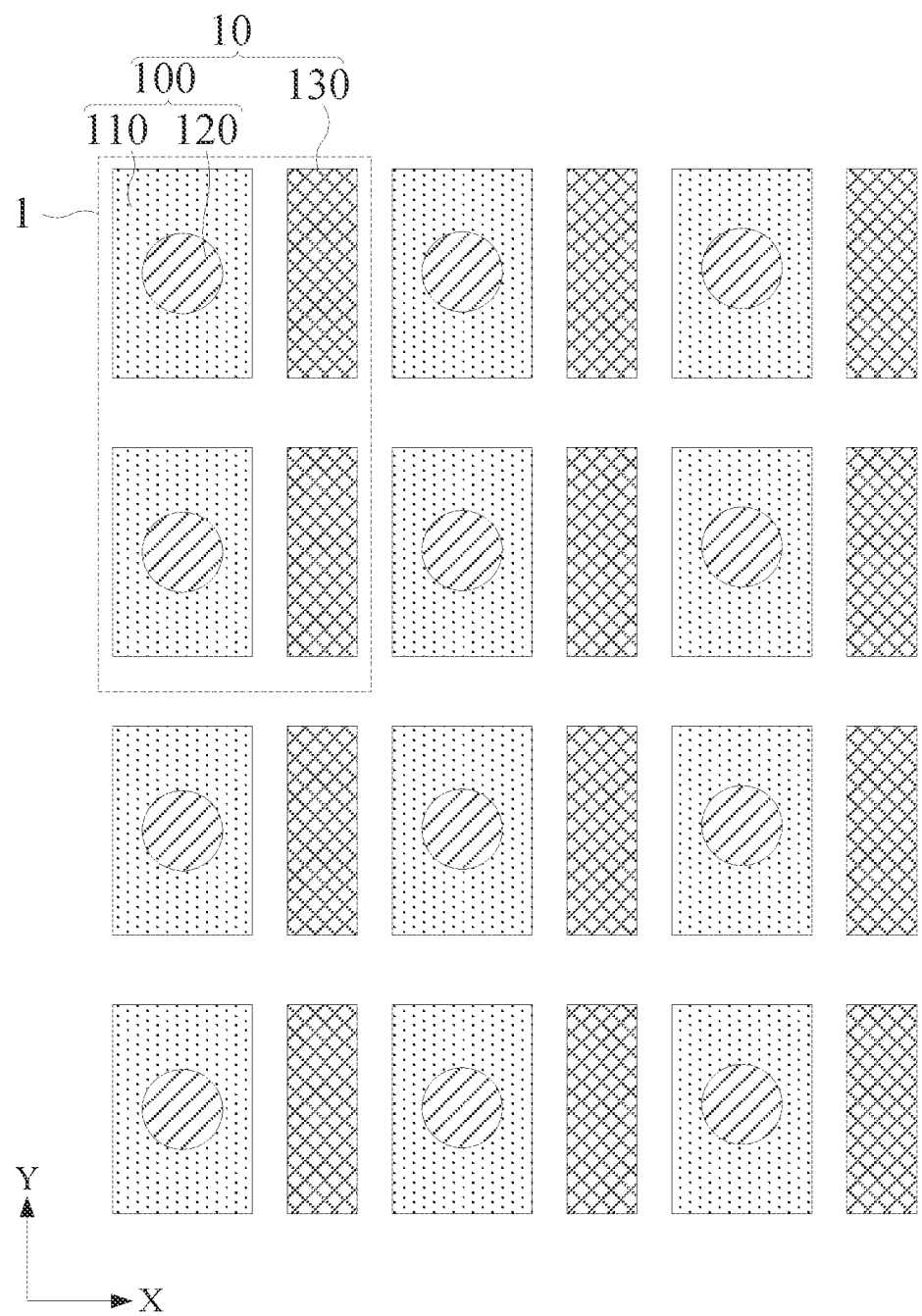
FIG. 7 is a schematic diagram of another pixel structure provided by an embodiment of the present disclosure.
Figure 8:
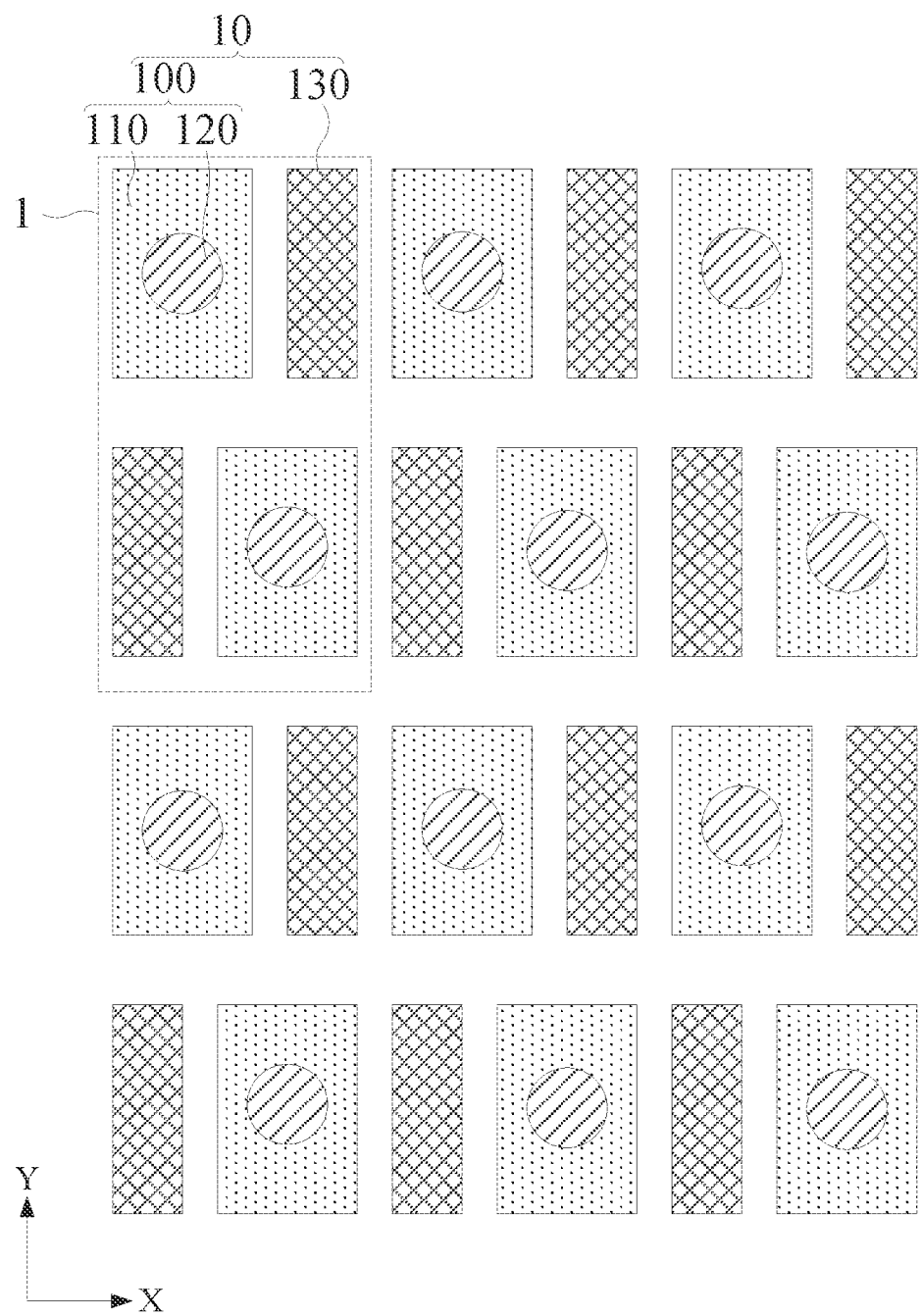
FIG. 8 is a schematic diagram of another pixel structure provided by an embodiment of the present disclosure.

FIG. 7 is a schematic diagram of another pixel structure provided by an embodiment of the present disclosure. FIG. 8 is a schematic diagram of another pixel structure provided by an embodiment of the present disclosure. The pixel structure shown in FIG. 7 is similar to the pixel structure shown in FIG. 2 and the pixel structure shown in FIG. 8 is similar to the pixel structure shown in FIG. 4 except that in FIGS. 7 and 8, the second sub-pixels 120 are circular in shape.

In an embodiment, in a case where the light-emitting functional layer of the sub-pixel is formed by using an inkjet printing technology, a droplet of the light-emitting functional layer material is circular in shape, and forms a circular film after dropping directly. In a case where the formed film is in other shapes other than the circle, the liquid light-emitting functional layer material needs to flow. Thus, the second sub-pixel 120 is configured to be circular in shape so that the second sub-pixel 120 can have a same shape as the droplet of the light-emitting functional layer material, and the liquid light-emitting functional layer material does not need to be further flowed and molded. In this manner, the formed film of the light-emitting functional layer material has a better uniformity.

Figure 9:
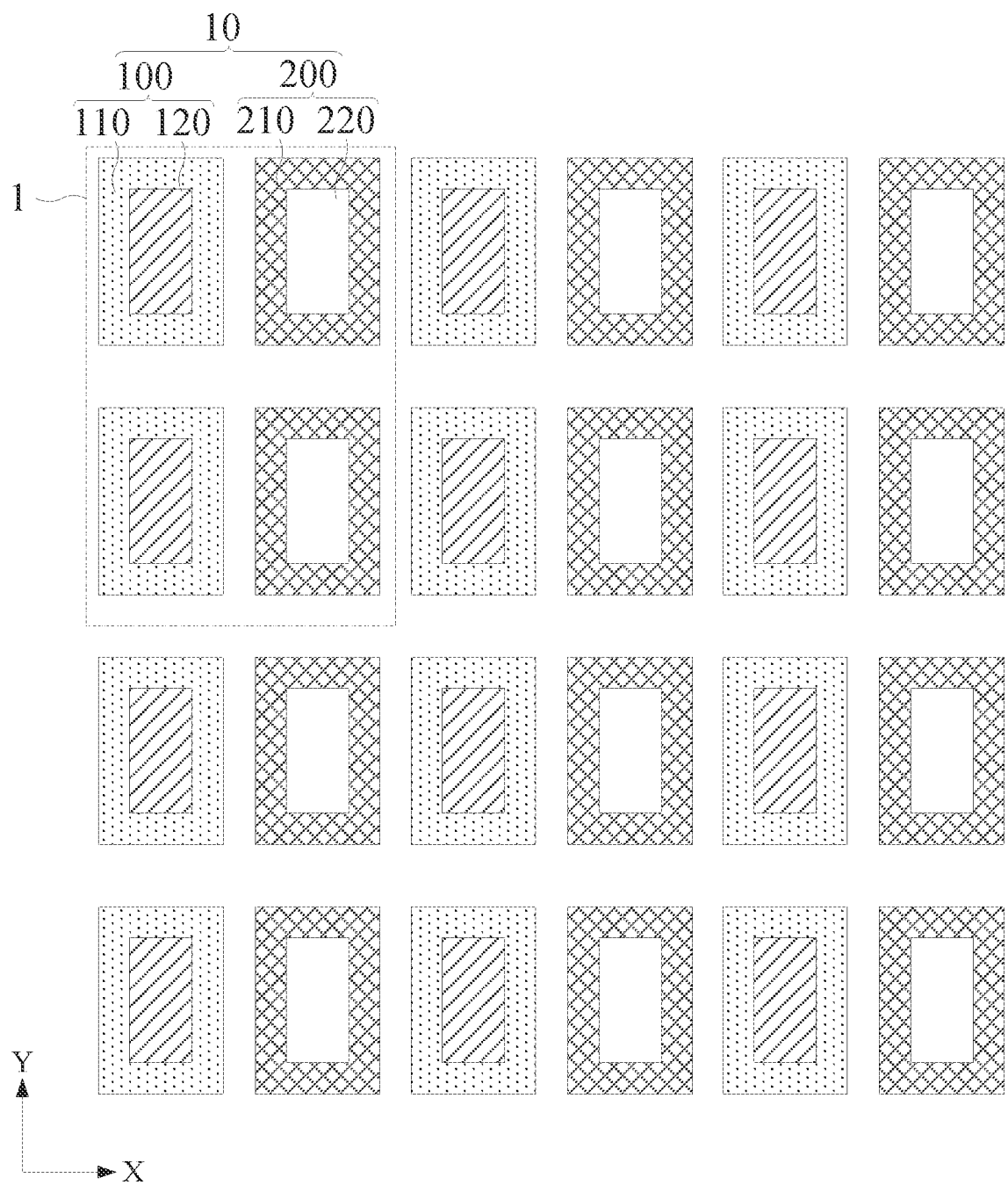
FIG. 9 is a schematic diagram of another pixel structure provided by an embodiment of the present disclosure.

FIG. 9 is a schematic diagram of another pixel structure provided by an embodiment of the present disclosure. As shown in FIG. 9, the pixel structure includes multiple first sub-pixel groups 100. Each of the multiple first sub-pixel groups 100 includes a first sub-pixel 110 and at least one second sub-pixel 120. The first sub-pixel 110 is disposed around the at least one second sub-pixel 120, an emission color of the first sub-pixel 110 is a first color, and an emission color of the at least one second sub-pixel 120 is a second color. In an embodiment, the pixel structure includes multiple second sub-pixel groups 200, each of the multiple second sub-pixel groups 200 includes a fourth sub-pixel 210 and at least one fifth sub-pixel 220, the fourth sub-pixel 210 is disposed around the at least one fifth sub-pixel 220, an emission color of the fourth sub-pixel 210 is a fourth color, and an emission color of the at least one fifth sub-pixel 220 is a fifth color; and in a first direction, a first sub-pixel group 100 and a second sub-pixel group 200 adjacent to the first sub-pixel group 100 constitute a pixel unit 10, and multiple pixel units 10 are arranged in an array.

In this embodiment, such arrangement enables the pixel structure to include sub-pixels of four colors, and sub-pixels of every two colors form a nested structure, so that the sub-pixels of four different colors in the pixel unit 10 are arranged more compact, which facilitates the improvement of the display effect of the display device.

In an embodiment, any one of the first color, the second color and the fourth color is selected from one of red, green and blue, the fifth color is any one of white or yellow, and the first color, the second color, the fourth color and the fifth color are different colors.

Colors of the first sub-pixel 110, the second sub-pixel 120, the fourth sub-pixel 210 and the fifth sub-pixel 220 are not limited by this embodiment and any solution satisfying the above color arrangement falls within the scope of this embodiment.

In an embodiment, the emission color of the first sub-pixel 110 and the emission color of the fourth sub-pixel 210 each is selected from one of blue and red, the emission color of the first sub-pixel 110 is different from the emission color of the fourth sub-pixel 210, and the emission color of the second sub-pixel 120 is green, where an area of the fifth sub-pixel 220 having an emission color of white or yellow is larger than an area of the second sub-pixel 120 having an emission color of green, and the area of the second sub-pixel 120 is larger than an area of the first sub-pixel 110 and an area of the fourth sub-pixel 210. In an embodiment, in a case where the emission color of the first sub-pixel 110 is red, an area ratio of the first sub-pixel 110, the second sub-pixel 120, the fourth sub-pixel 210 and the fifth sub-pixel 220 may be 10:12:9:18; and in a case where the emission color of the first sub-pixel 110 is blue, the area ratio of the first sub-pixel 110, the second sub-pixel 120, the fourth sub-pixel 210, and the fifth sub-pixel 220 may be 9:12:10:18. The above ratio relationship is merely illustrative and not restrictive. A designer can reasonably adjust the area ratio of the multiple sub-pixels according to actual needs, which is not limited in this embodiment.

In an embodiment, referring to FIG. 9, two adjacent pixel units 10 constitute a pixel unit group 1 in a direction Y vertical to the first direction X, and two pixel units 10 in the same pixel unit group 1 have the same structure.

Figure 10:
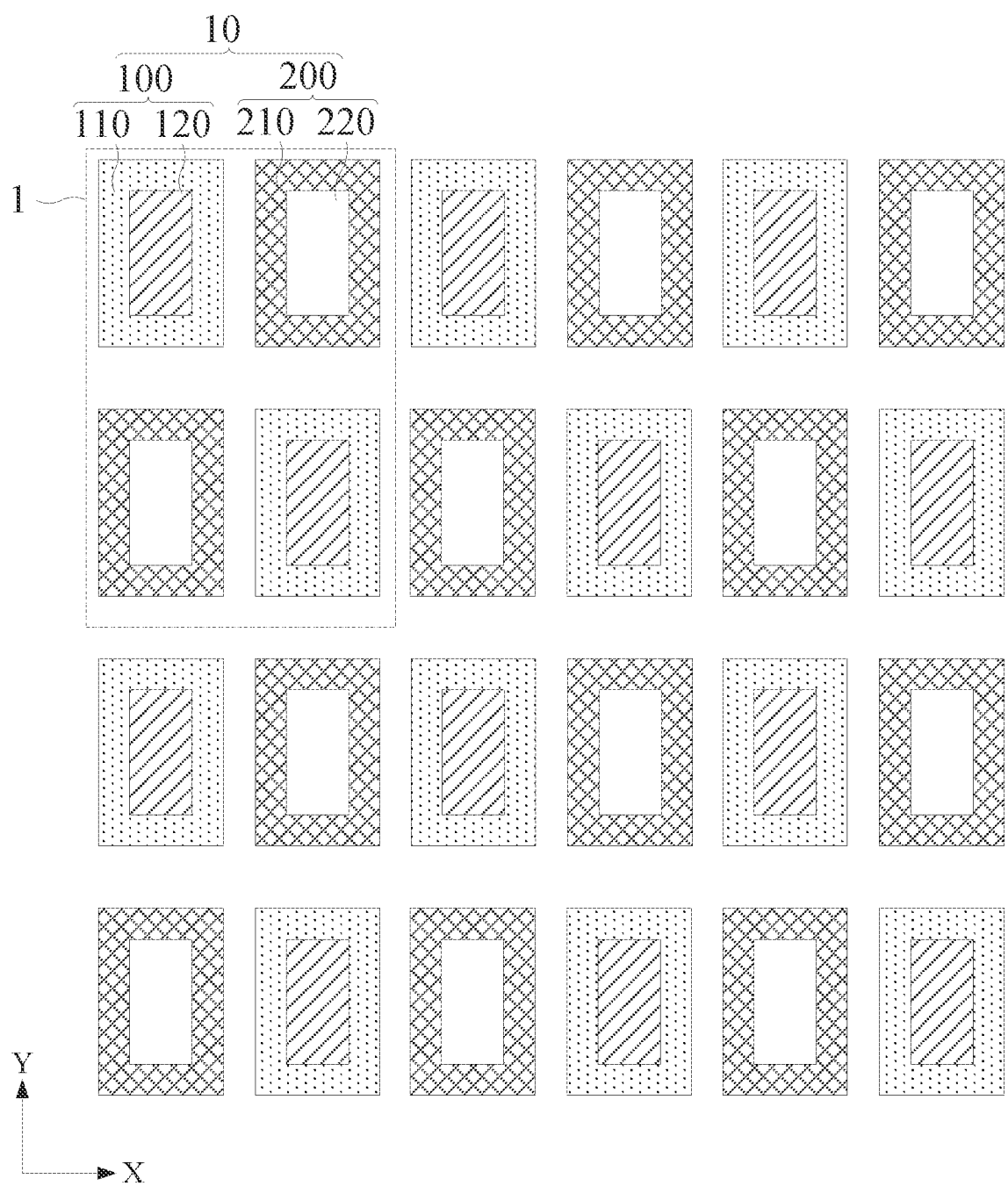
FIG. 10 is a schematic diagram of another pixel structure provided by an embodiment of the present disclosure.

FIG. 10 is a schematic diagram of another pixel structure provided by an embodiment of the present disclosure. The pixel structure shown in FIG. 10 is similar to the pixel structure shown in FIG. 9 except that arrangement orders of a first sub-pixel group 100 and a second sub-pixel group 200 in two pixel units 10 in a same pixel unit group 1 in a first direction X are different.

In this embodiment, the pixel unit group 1 is a minimum repeating unit in the pixel structure, and multiple pixel unit groups 1 are repeatedly arranged to constitute the pixel structure.

In an embodiment, as shown in FIG. 10, the arrangement orders being different refers to that the first sub-pixel group 100 and the second sub-pixel group 200 in one pixel unit 10 in the pixel unit group 1 are sequentially arranged in the first direction X, and the second sub-pixel group 200 and the first sub-pixel group 100 in another pixel unit 10 in the pixel unit group 1 are sequentially arranged in the first direction X. That is, the first sub-pixel groups 100 in the two pixel units 10 in the same pixel unit group 1 have an identical structure, the second sub-pixel group 200 in the two pixel units 10 in the same pixel unit group 1 also have an identical structure, and only the arrangement orders of the first sub-pixel group and the second sub-pixel group are different.

Such structure shown in FIG. 10 prevents sub-pixels of a same color from being arranged adjacently in the first direction or the direction Y vertical to the first direction X, thereby reducing the probability of the occurrence of bright lines and facilitating improving the display effect of the display device.

Figure 11:
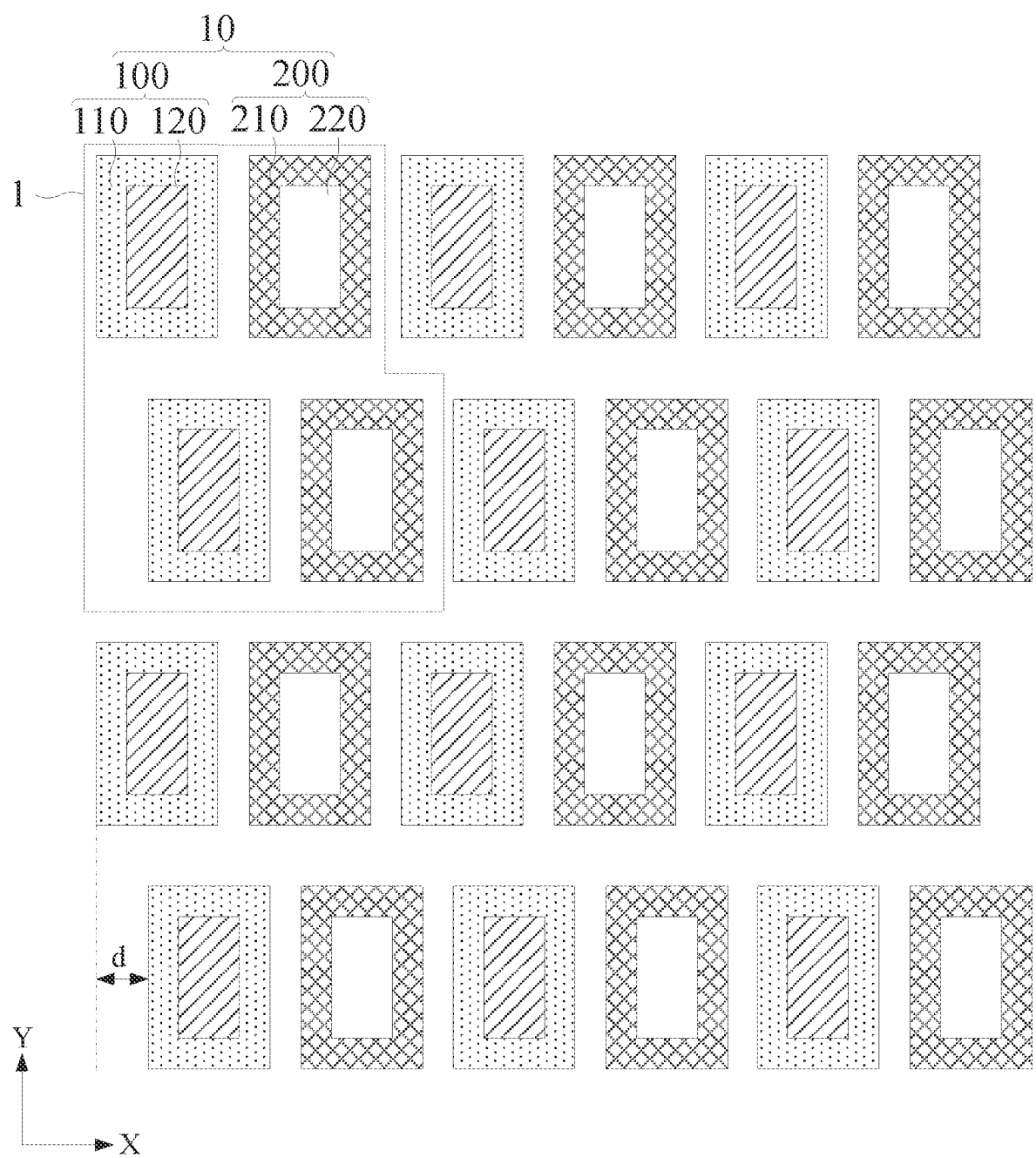
FIG. 11 is a schematic diagram of another pixel structure provided by an embodiment of the present disclosure.
Figure 12:
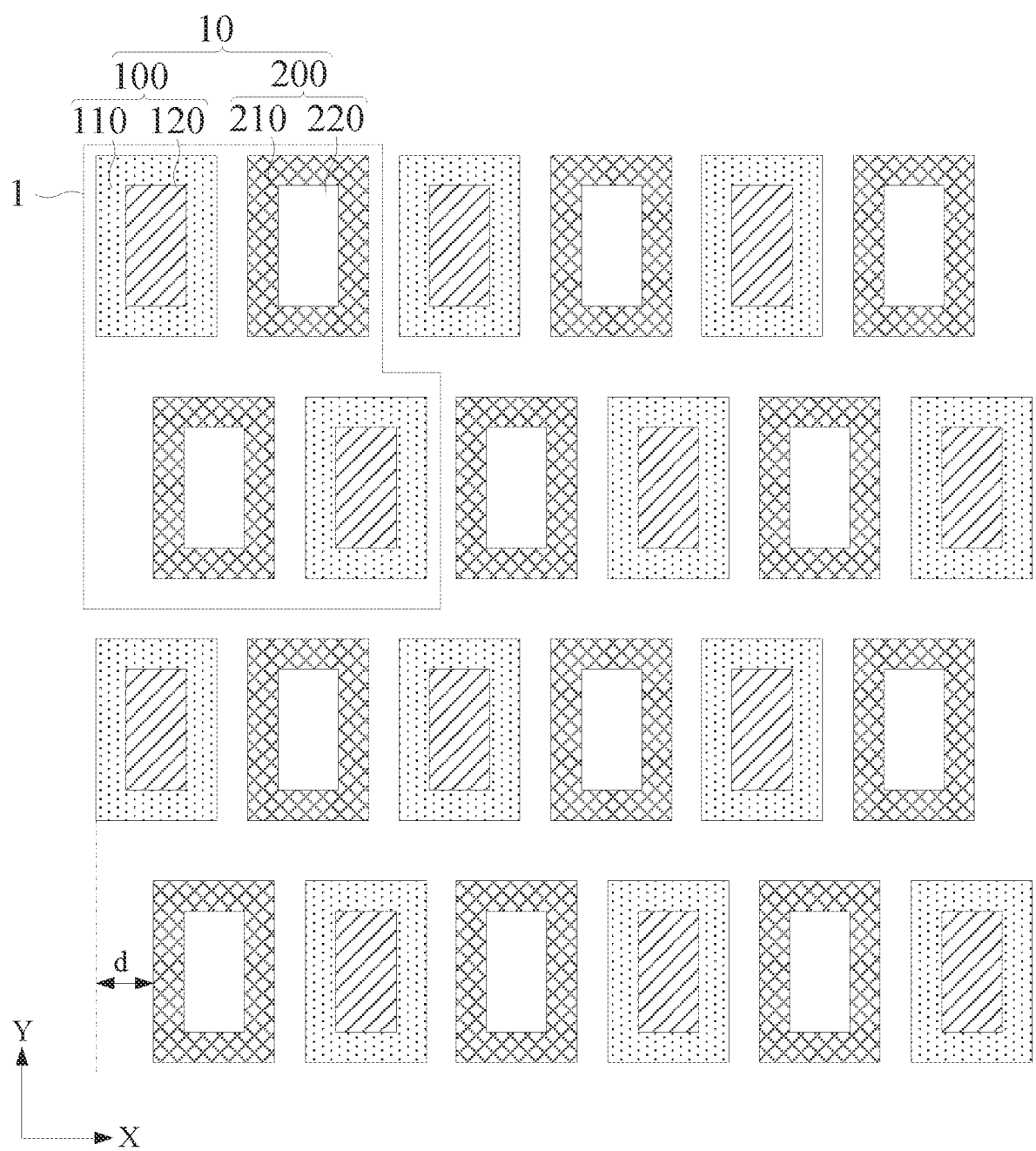
FIG. 12 is a schematic diagram of another pixel structure provided by an embodiment of the present disclosure.

FIG. 11 is a schematic diagram of another pixel structure provided by an embodiment of the present disclosure. FIG. 12 is a schematic diagram of another pixel structure provided by an embodiment of the present disclosure. The pixel structure shown in FIG. 11 is similar to the pixel structure shown in FIG. 9, and the pixel structure shown in FIG. 12 is similar to the pixel structure shown in FIG. 10 except that in FIGS. 11 and 12, two pixel units 10 in a same pixel unit group 1 are misaligned in a first direction X and a misalignment width d is less than a width of a first sub-pixel group 100.

In this embodiment, such arrangement enables sub-pixels of different emission colors to be more compactly arranged, which facilitates color mixture of light of different colors emitted by multiple sub-pixels and further improves the display effect of the display device.

In an embodiment, as shown in FIGS. 5, 6, 11 and 12, the misalignment width d may be equal to a half of a width of the first sub-pixel group 100.

Experiments showed that in a case where the misalignment width d is equal to a half of the width of the first sub-pixel group 100, sub-pixels of four different colors in the pixel unit 10 have the highest compactness and the best color mixing effect, thereby enabling the display device to have a better display effect.

Figure 13:
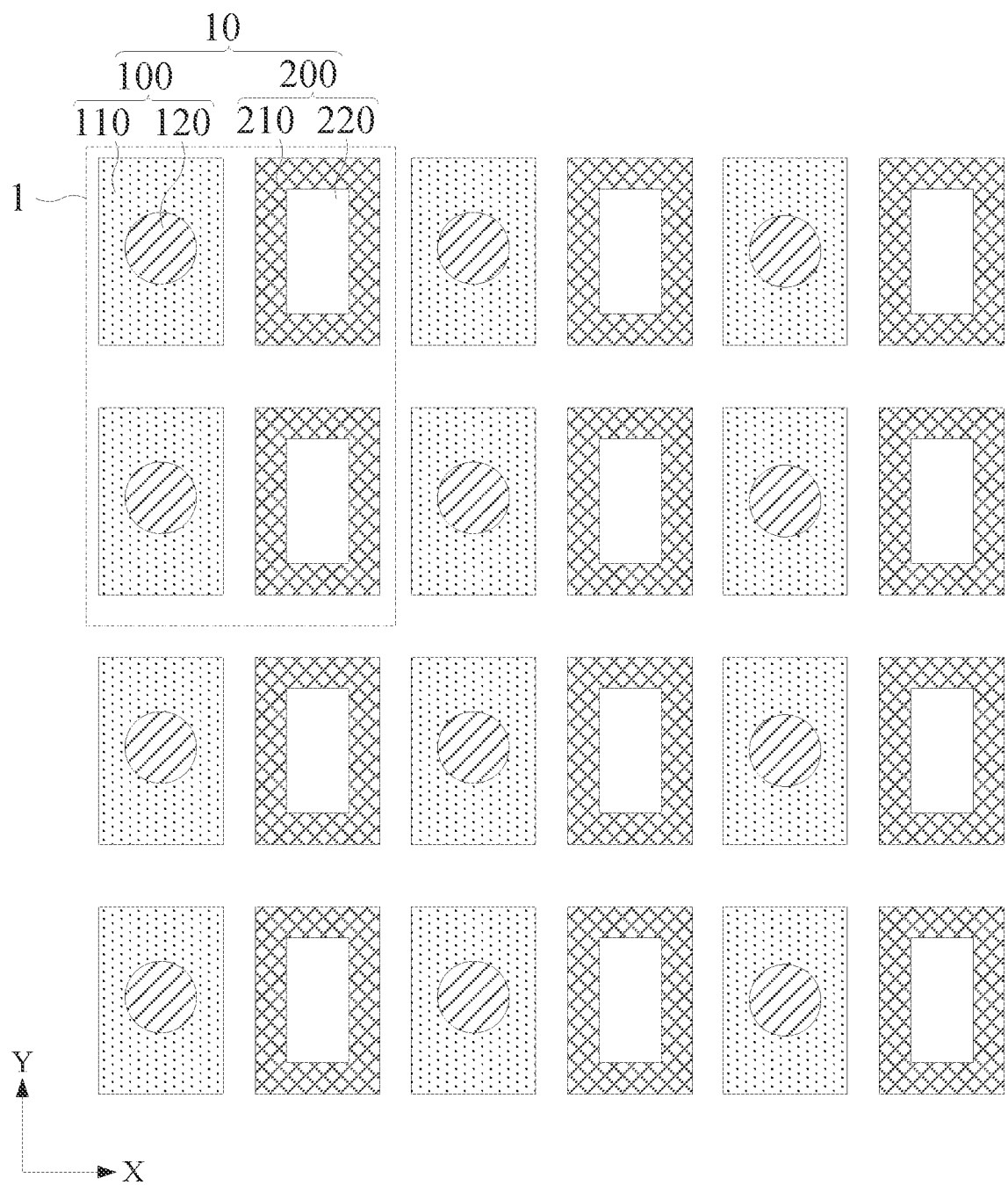
FIG. 13 is a schematic diagram of another pixel structure provided by an embodiment of the present disclosure.
Figure 14:
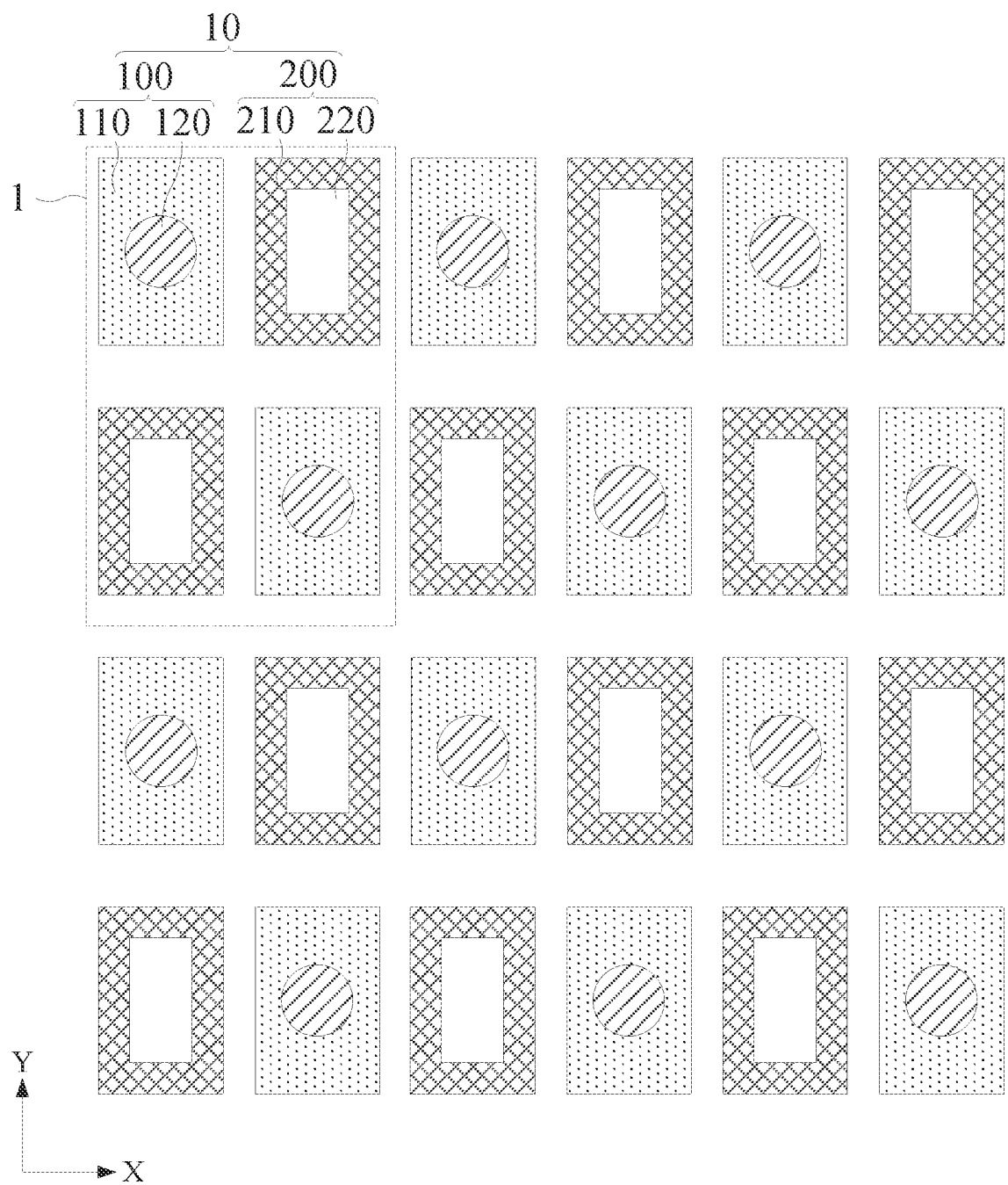
FIG. 14 is a schematic diagram of another pixel structure provided by an embodiment of the present disclosure.

FIG. 13 is a schematic diagram of another pixel structure provided by an embodiment of the present disclosure. FIG. 14 is a schematic diagram of another pixel structure provided by an embodiment of the present disclosure. The pixel structure shown in FIG. 13 is similar to the pixel structure shown in FIG. 9, and the pixel structure shown in FIG. 14 is similar to the pixel structure shown in FIG. 10 except that in FIGS. 13 and 14, second sub-pixels 120 are circular in shape.

In this embodiment, such arrangement enables the second sub-pixel 120 have the same shape as a droplet of the light-emitting functional layer material when the light-emitting functional layer material of the sub-pixel is formed by using an inkjet printing technology, and thus the formed film light-emitting functional layer material has a better uniformity, referring to the preceding related contents for details, which will not be repeated herein.

Figure 15:
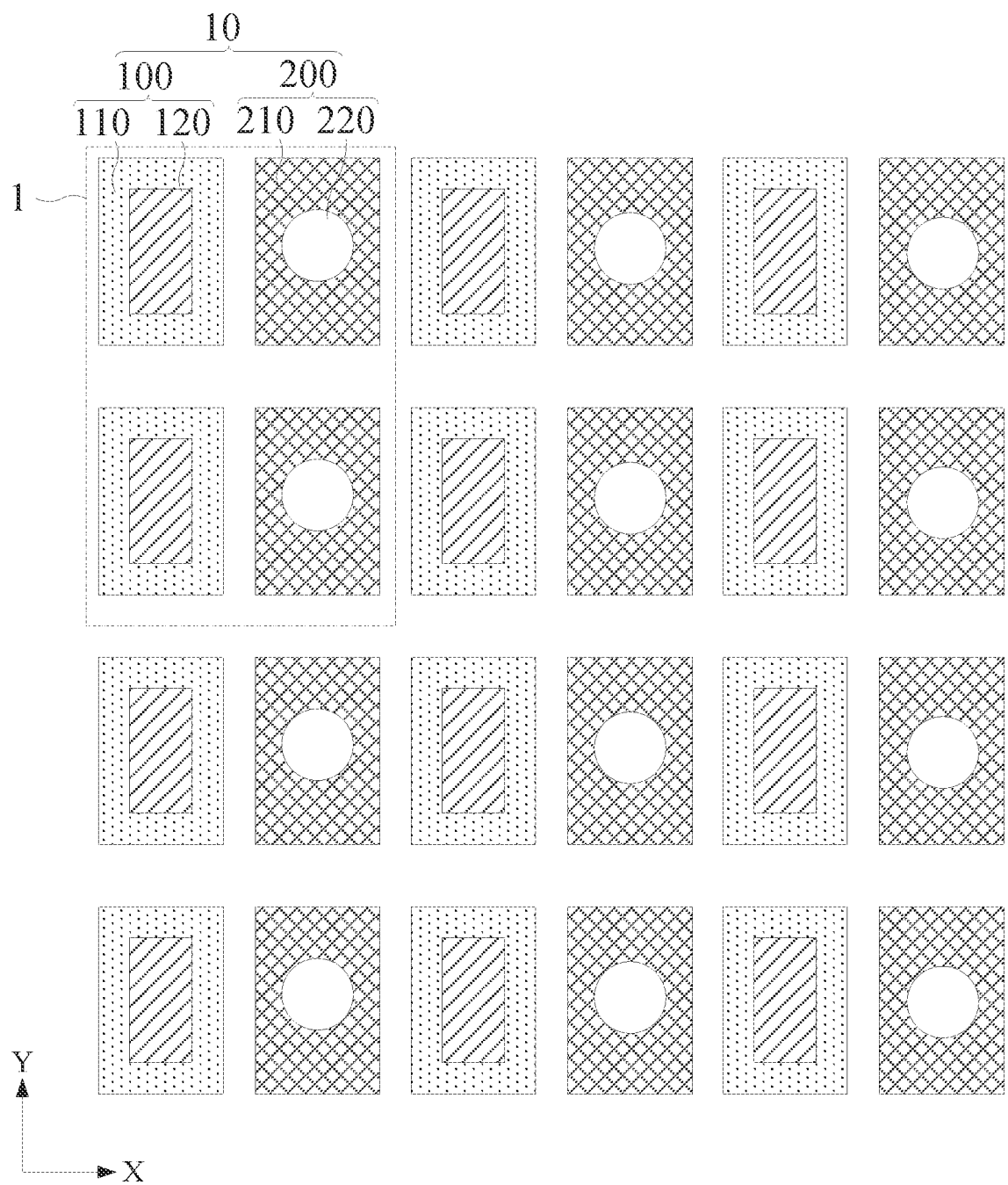
FIG. 15 is a schematic diagram of another pixel structure provided by an embodiment of the present disclosure.
Figure 16:
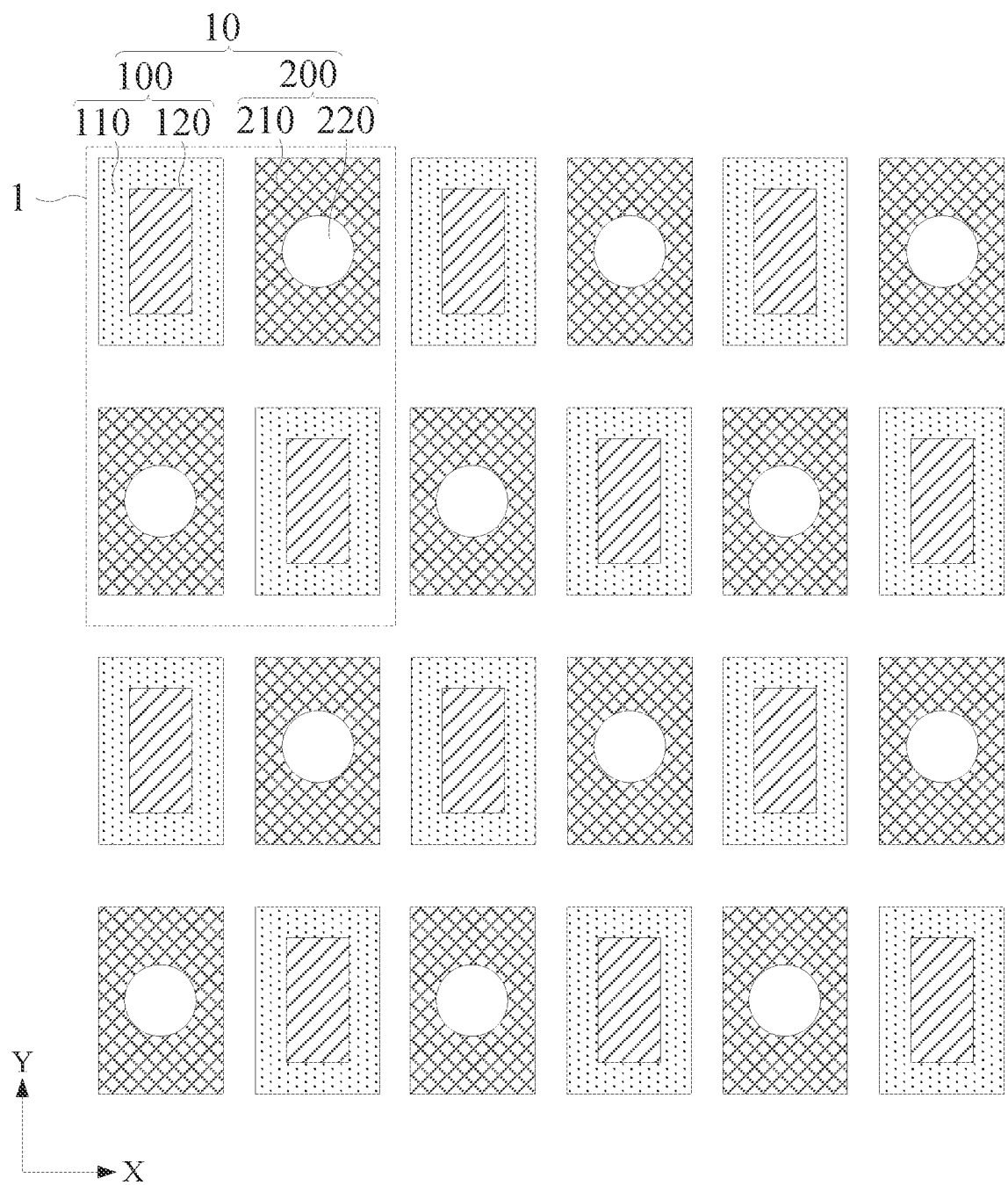
FIG. 16 is a schematic diagram of another pixel structure provided by an embodiment of the present disclosure.

FIG. 15 is a schematic diagram of another pixel structure provided by an embodiment of the present disclosure. FIG. 16 is a schematic diagram of another pixel structure provided by an embodiment of the present disclosure. The pixel structure shown in FIG. 15 is similar to the pixel structure shown in FIG. 9, and the pixel structure shown in FIG. 16 is similar to the pixel structure shown in FIG. 10 except that in FIGS. 15 and 16, fifth sub-pixels 220 are circular in shape.

In this embodiment, such arrangement enables the fifth sub-pixel 220 to have the same shape as a droplet of the light-emitting functional layer material when the light-emitting functional layer material of the sub-pixel is formed by using an inkjet printing technology, and thus the formed film of the light-emitting functional layer material has a better uniformity, referring to the preceding related contents for details, which will not be not repeated herein.

Figure 17:
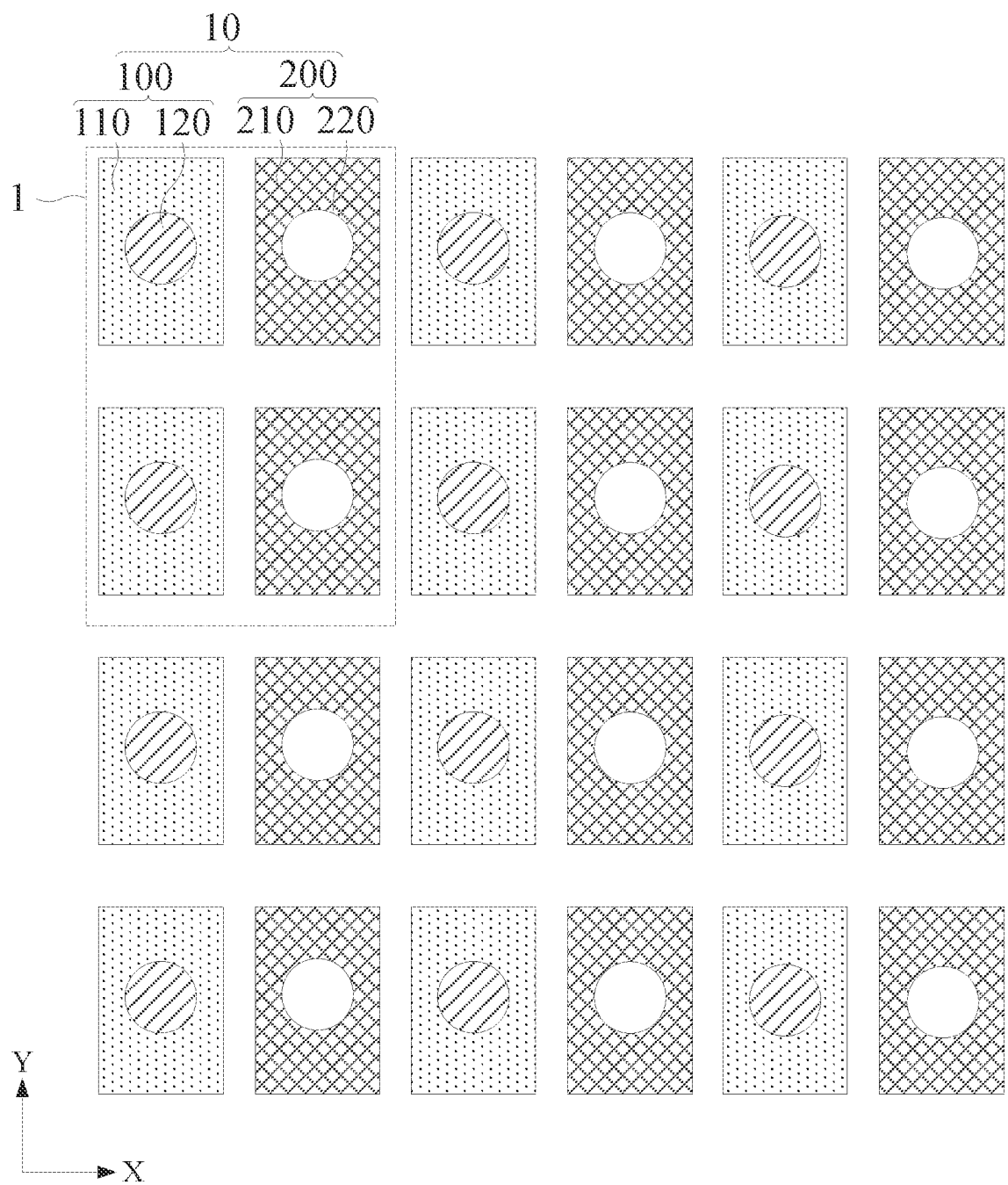
FIG. 17 is a schematic diagram of another pixel structure provided by an embodiment of the present disclosure.
Figure 18:
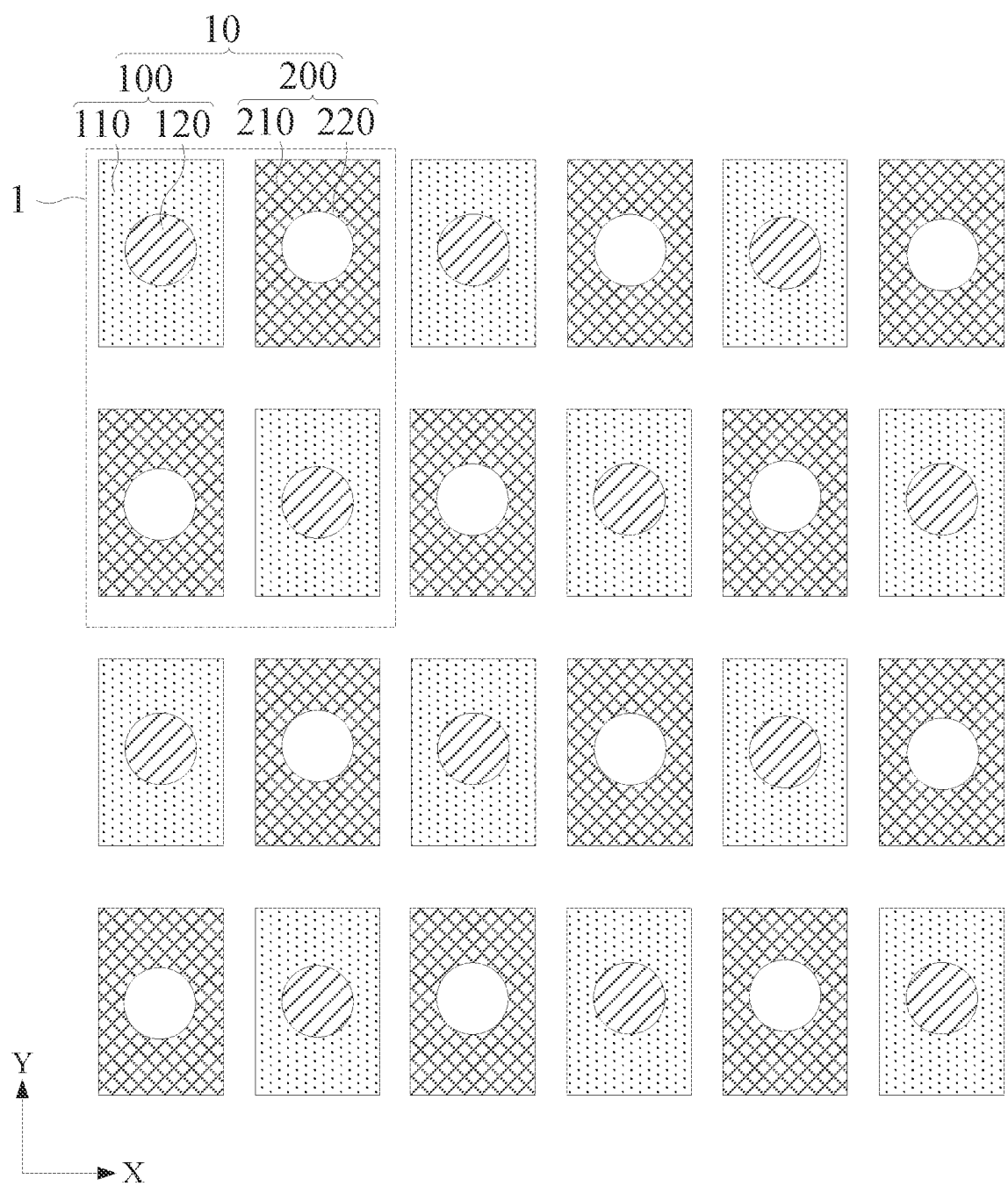
FIG. 18 is a schematic diagram of another pixel structure provided by an embodiment of the present disclosure.

FIG. 17 is a schematic diagram of another pixel structure provided by an embodiment of the present disclosure. FIG. 18 is a schematic diagram of another pixel structure provided by an embodiment of the present disclosure. The pixel structure shown in FIG. 17 is similar to the pixel structure shown in FIG. 9, and the pixel structure shown in FIG. 18 is similar to the pixel structure shown in FIG. 10 except that in FIGS. 17 and 18, second sub-pixels 120 and fifth sub-pixels 220 are all circular in shape.

In this embodiment, such arrangement enables the second sub-pixel 120 and the fifth sub-pixel 220 to have the same shape as a droplet of the light-emitting functional layer material when the light-emitting functional layer material of the sub-pixel is formed by using an inkjet printing technology, thus the formed film of the light-emitting functional layer material has a better uniformity, referring to the preceding related contents for details, which will not be repeated herein.

Embodiments of the present disclosure further provide a pixel structure. The pixel structure includes multiple first sub-pixel groups. Each of the multiple first sub-pixel groups includes a first sub-pixel and at least two second sub-pixels, the at least two second sub-pixels have different emission colors, and the first sub-pixel is disposed around the at least two second sub-pixels, an emission color of the first sub-pixel is different from an emission color of any second sub-pixel.

The pixel structure provided by the embodiment of the present disclosure includes at least multiple first sub-pixel groups, each of the multiple first sub-pixel groups includes the first sub-pixel and at least two second sub-pixels, the at least two second sub-pixels have different emission colors, the first sub-pixel is disposed around the at least two second sub-pixels, the emission color of the first sub-pixel is different from the emission color of any second sub-pixel, so that the first sub-pixel and any second sub-pixel which have different emission colors in the same first sub-pixel group are in a nested relationship, which facilitates color mixture of light of different colors emitted by the multiple sub-pixels during the display process, and further improves the display effect of the display device. In addition, in the above nested relationship, the sub-pixel at a periphery has a relatively large width, thus a process implementation area of this sub-pixel is relatively large, which facilitates reducing the preparation difficulty of the display device.

As shown in FIG. 3, the pixel structure includes multiple first sub-pixel groups 100, each of the multiple first sub-pixel groups 100 includes a first sub-pixel 110 and at least two second sub-pixels 120, the at least two second sub-pixels 120 have different emission colors, the first sub-pixel 110 is disposed around the at least two second sub-pixels 120 and an emission color of the first sub-pixel 110 is different from an emission color of any second sub-pixel 120.

In this embodiment, in FIG. 3, the first sub-pixel group 100 includes two second sub-pixels 120, which is taken as an example for description and is not intended to limit the number of second sub-pixels 120 in the first sub-pixel group 100. In other implementations of this embodiment, the number of second sub-pixels 120 in the first sub-pixel group 100 may be greater than or equal to three.

The arrangement mode of at least two second sub-pixels 120 in the same first sub-pixel group 100 is not limited in this embodiment. In addition, other structures in the pixel structure other than the first sub-pixel group 100 is not limited in this embodiment. In an embodiment, any solution that satisfies the following condition falls within the scope of this embodiment: in the same first sub-pixel group 100, the first sub-pixel 110 is disposed around at least two second sub-pixels 120, the emission colors of the at least two second sub-pixels 120 are different, the emission color of the first sub-pixel 110 is different from the emission color of any second sub-pixel 120.

In an embodiment, multiple sub-pixels in the first sub-pixel group 100 have different emission colors, so that the sub-pixels of multiple colors are compactly arranged, and light of different colors emitted by the multiple sub-pixels is easier to mix, thereby avoiding the occurrence of the polarization phenomenon. In addition, the first sub-pixel 110 is disposed around multiple second sub-pixels 120, and the multiple second sub-pixels 120 form a nested structure with only the first sub-pixel 110. A width of the first sub-pixel 110 at a periphery of the nested structure may be made larger, so a process implementation area of the first sub-pixel 110 is larger correspondingly.

The pixel structure provided by this embodiment at least includes multiple first sub-pixel groups 100, each of the multiple first sub-pixel groups 100 includes the first sub-pixel 110 and at least two second sub-pixels 120, the at least two second sub-pixels 120 have different emission colors, the first sub-pixel 110 is disposed around the at least two second sub-pixels 120, the emission color of the first sub-pixel 110 is different from the emission color of any second sub-pixel 120, so that the first sub-pixel 110 and any second sub-pixel 120 which have different emission colors in the same first sub-pixel group 100 are in a nested relationship, which facilitates color mixture of light of different colors emitted by the multiple sub-pixels during the display process, and further improves the display effect of the display device. In addition, in the above nested relationship, the sub-pixel at a periphery has a relatively large width, thus a process implementation area of this sub-pixel is relatively large, which facilitates reducing the preparation difficulty of the display device.

Exemplarily, referring to FIG. 3, the pixel structure further includes multiple third sub-pixels 130, an emission color of the third sub-pixel is different from an emission color of the first sub-pixel 110, and in a first direction X, the first sub-pixel group 100 and the third sub-pixel 130 adjacent to the first sub-pixel group 100 constitute a pixel unit 10, and multiple pixel units 10 are arranged in an array.

In this embodiment, the emission color of the third sub-pixel 130 may be different from or the same as the emission color of any second sub-pixel 120, which is not limited in this embodiment.

In an embodiment, the first sub-pixel group 100 includes two second sub-pixels 120 of different emission colors, and the pixel unit 10 includes sub-pixels of four emission colors.

In this embodiment, in the pixel structure obtained by the above arrangement mode, the pixel unit 10 includes one first sub-pixel 110, two second sub-pixels 120 and one third sub-pixel 130, that is, the pixel unit 10 includes four sub-pixels, and each of the four sub-pixels has a different emission color.

Exemplarily, the above four colors are selected from red, green, blue and any one of white or yellow.

In an embodiment, red, green and blue are three primary colors of light, and red, green and blue of different intensities can be mixed to obtain light of multiple colors, so that the display device can display various colors and the display color of the display device can be enriched. The arrangement of white sub-pixels or yellow sub-pixels can improve the brightness and the color expression of the display panel, and the increased transmittance improves the gray scale and the light-dark expression of the display device itself, which is beneficial for further enhancing the display effect of the display device.

Colors of the first sub-pixel 110, each second sub-pixel 120, the third sub-pixel 130 are not limited by this embodiment and any solution satisfying the above color arrangement falls within the protection scope of this embodiment.

In an embodiment, referring to FIG. 3, two adjacent pixel units 10 constitute a pixel unit group 1 in a direction Y vertical to the first direction X, and two-pixel units 10 in the same pixel unit group 1 have a same structure.

Figure 19:
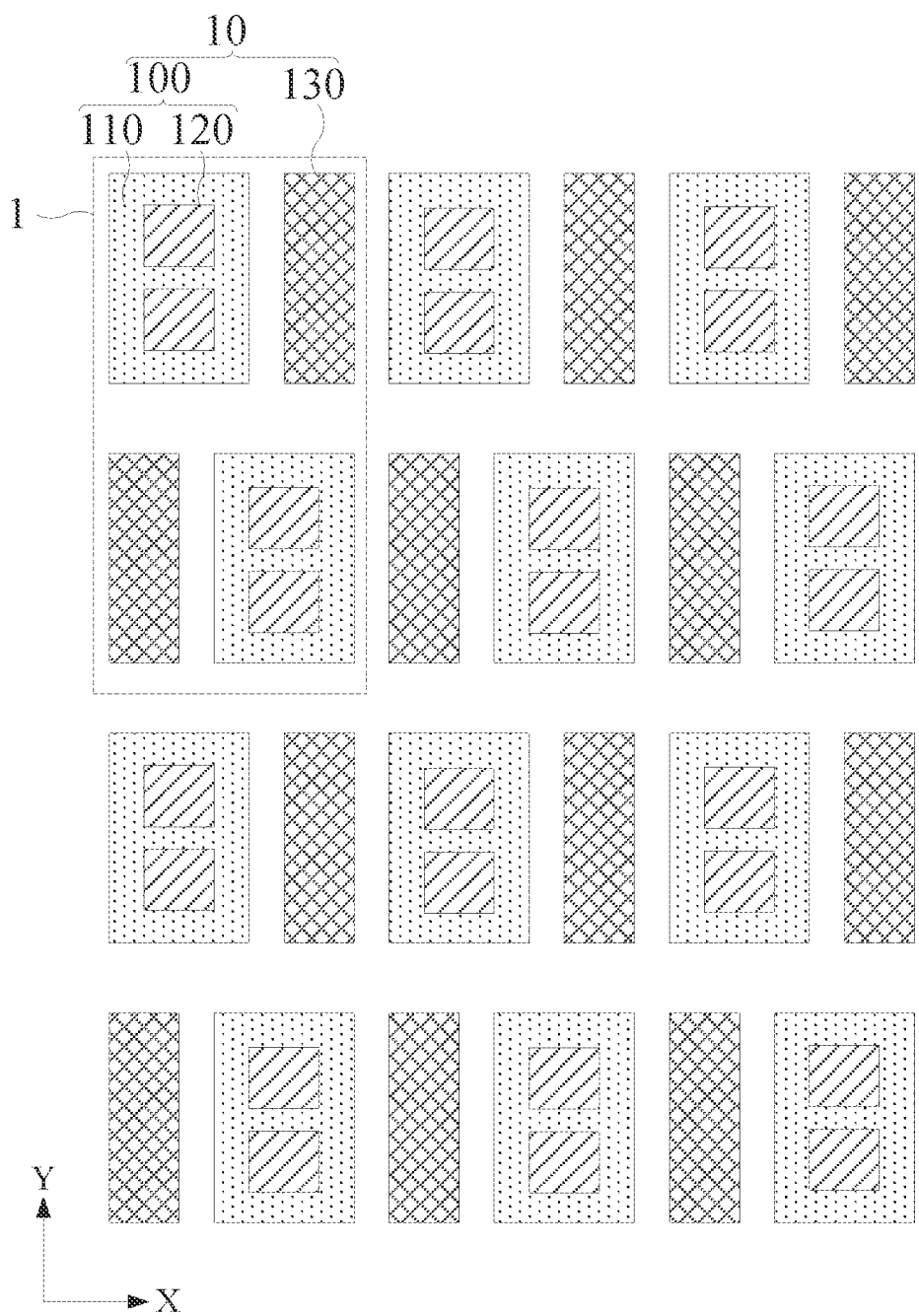
FIG. 19 is a schematic diagram of another pixel structure provided by an embodiment of the present disclosure.

FIG. 19 is a schematic diagram of another pixel structure provided by an embodiment of the present disclosure. The pixel structure shown in FIG. 19 is different from the pixel structure shown in FIG. 3 in that in FIG. 19, arrangement orders of a first sub-pixel group 100 and a third sub-pixel 130 in two pixel units 10 in a same pixel unit group 1 in a first direction are different.

In this embodiment, the pixel unit group 1 is a minimum repeating unit in the pixel structure, and multiple pixel unit groups 1 are repeatedly arranged to constitute the pixel structure.

In an embodiment, as shown in FIG. 19, the arrangement orders being different refers to that the first sub-pixel group 100 and the third sub-pixel 130 in one pixel unit 10 in the pixel unit group 1 are sequentially arranged in the first direction X, and the third sub-pixel 130 and the first sub-pixel group 100 in another pixel unit 10 in the pixel unit group 1 are sequentially arranged in the first direction X. That is, the first sub-pixel groups 100 in the two pixel units 10 in the same pixel unit group 1 have an identical structure, the third sub-pixels 130 in the two pixel units 10 in the same pixel unit group 1 also have an identical structure, and only the arrangement orders of the first sub-pixel group and the third sub-pixel are different.

Such structure shown in FIG. 19 prevents sub-pixels of a same color from being arranged adjacently in a direction Y vertical to the first direction X, thereby reducing the probability of the occurrence of bright lines and facilitating improving the display effect of the display device.

Figure 20:
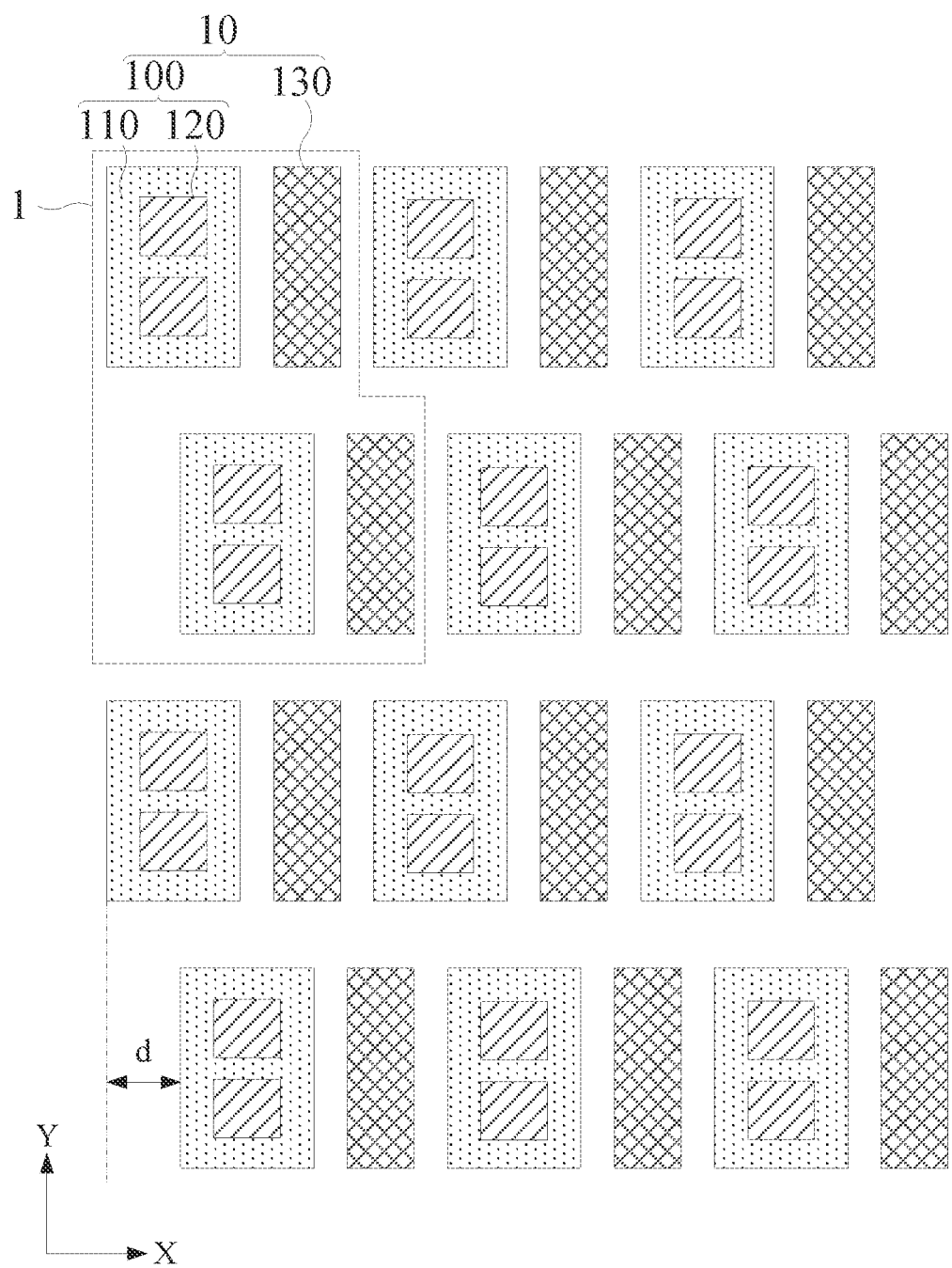
FIG. 20 is a schematic diagram of another pixel structure provided by an embodiment of the present disclosure.
Figure 21:
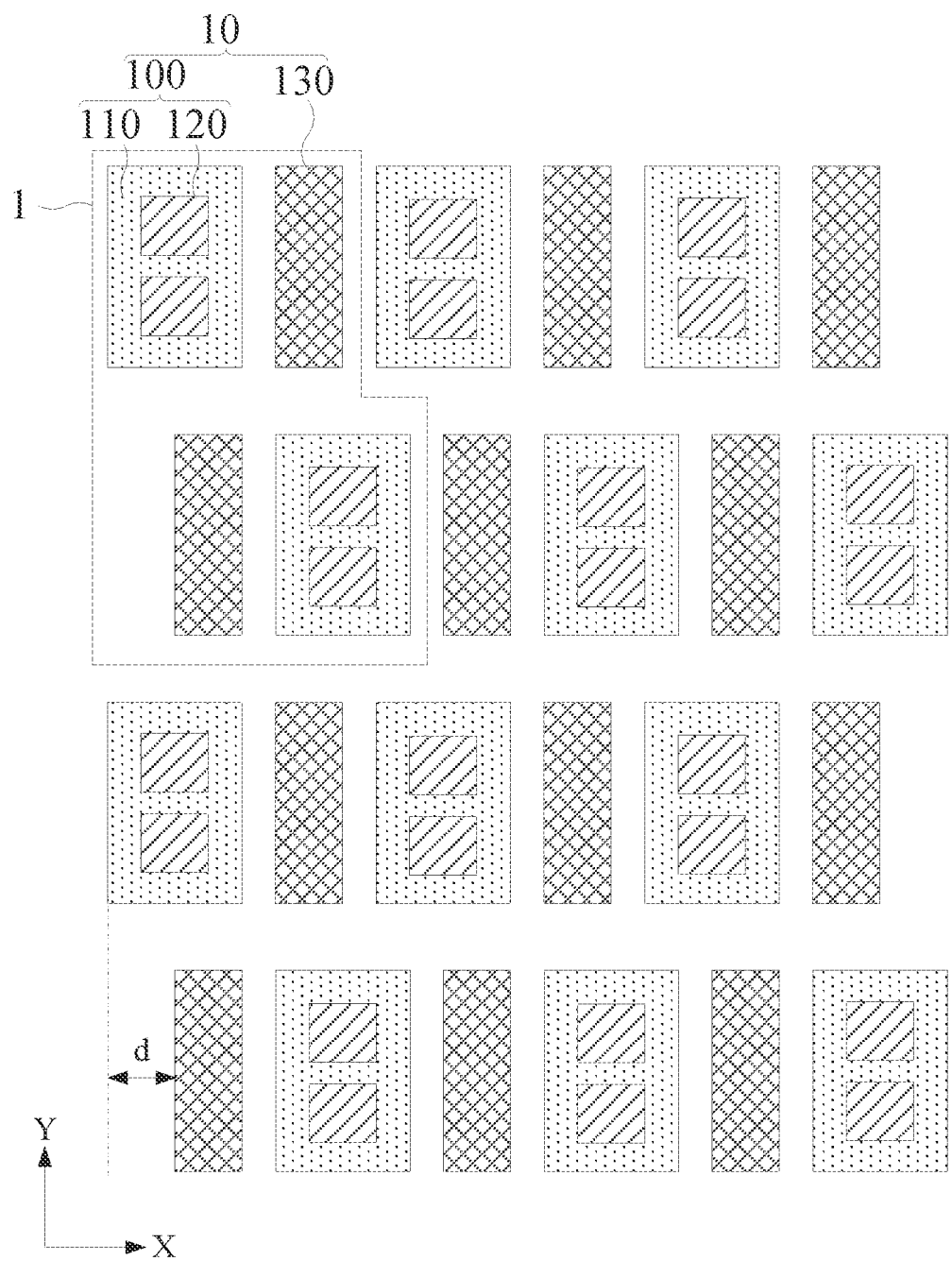
FIG. 21 is a schematic diagram of another pixel structure provided by an embodiment of the present disclosure.

FIG. 20 is a schematic diagram of another pixel structure provided by an embodiment of the present disclosure. FIG. 21 is a schematic diagram of another pixel structure provided by an embodiment of the present disclosure. The pixel structure shown in FIG. 20 is similar to the pixel structure shown in FIG. 3, and the pixel structure shown in FIG. 21 is similar to the pixel structure shown in FIG. 19 except that in FIGS. 20 and 21, two pixel units 10 in a same pixel unit group 1 are misaligned in a first direction X and a misalignment width d is less than a width of a first sub-pixel group 100.

In this embodiment, such arrangement enables sub-pixels of different emission colors to be more compactly arranged, which facilitates color mixture of light of different colors emitted by multiple sub-pixels and further improves the display effect of the display device.

Figure 22:
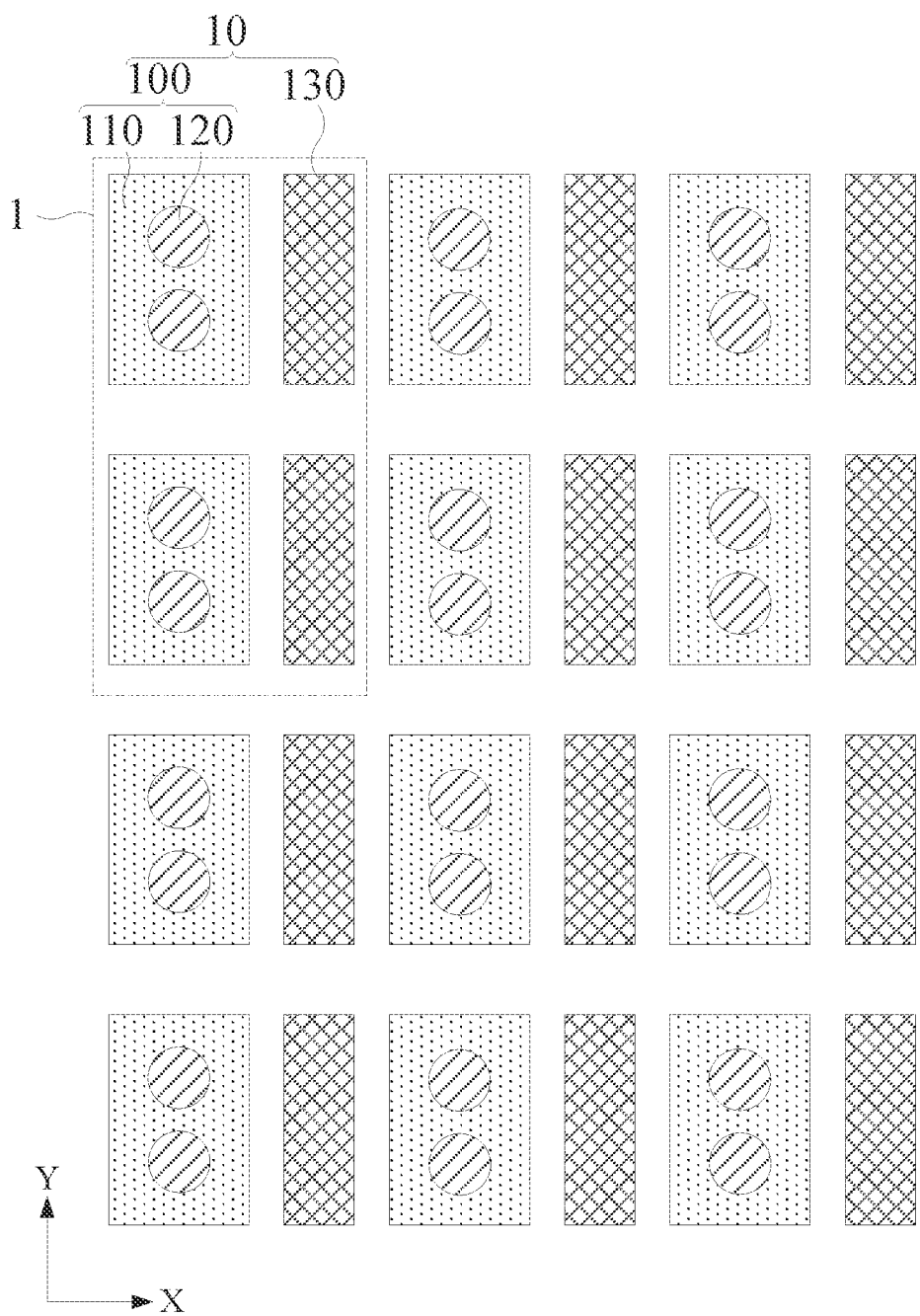
FIG. 22 is a schematic diagram of another pixel structure provided by an embodiment of the present disclosure.
Figure 23:
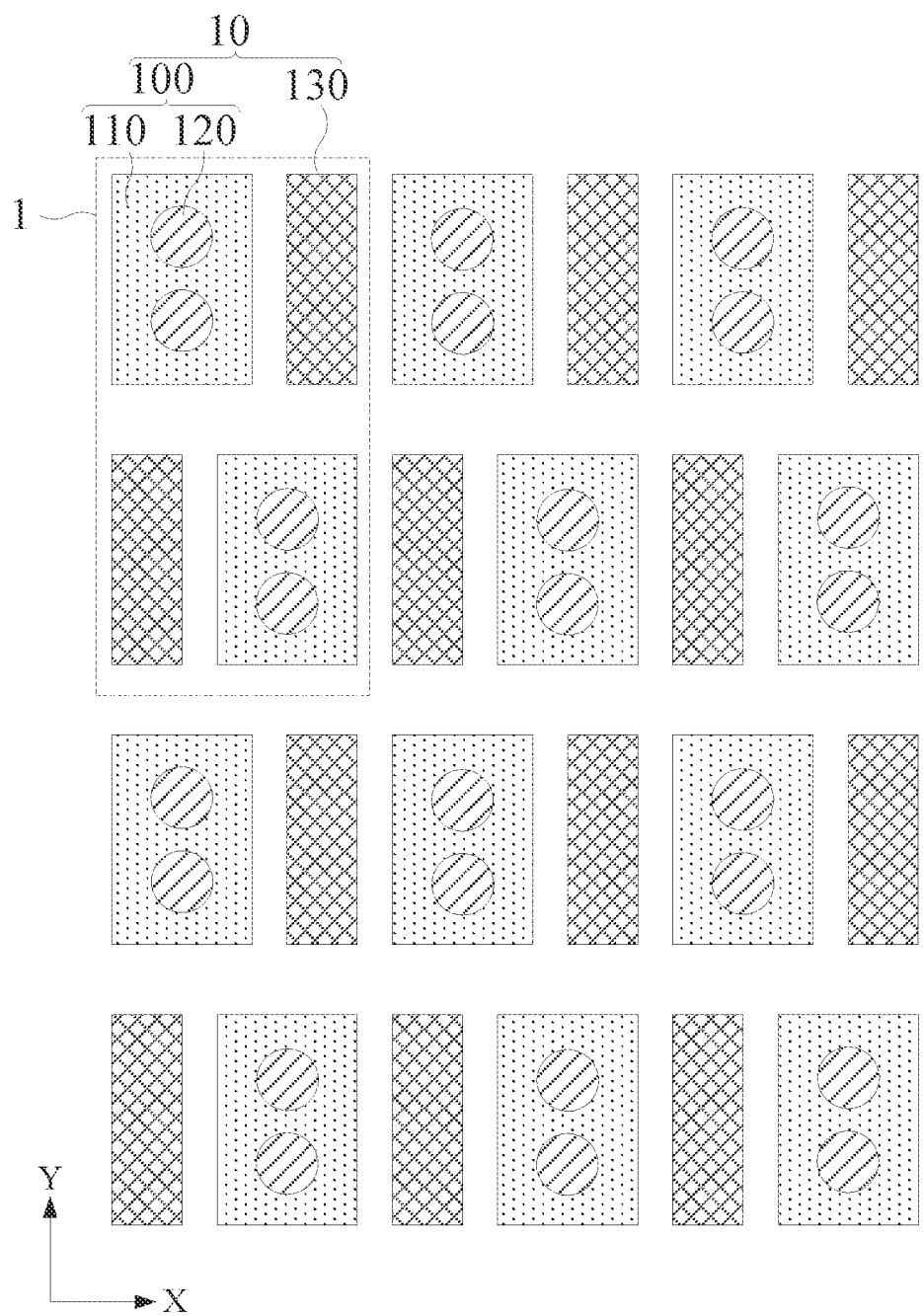
FIG. 23 is a schematic diagram of another pixel structure provided by an embodiment of the present disclosure.

FIG. 22 is a schematic diagram of another pixel structure provided by an embodiment of the present disclosure. FIG. 23 is a schematic diagram of another pixel structure provided by an embodiment of the present disclosure. The pixel structure shown in FIG. 22 is similar to the pixel structure shown in FIG. 3 and the pixel structure shown in FIG. 23 is similar to the pixel structure shown in FIG. 19 except that in FIGS. 22 and 23, the second sub-pixels 120 are circular in shape.

In an embodiment, in a case where the light-emitting functional layer of the sub-pixel is formed by using an inkjet printing technology, a droplet of the light-emitting functional layer material is circular in shape, and forms a circular film after dropping directly. In a case where the formed film is other shapes other than the circle, the liquid light-emitting functional layer material needs to flow. Thus, the second sub-pixel 120 is configured to be circular in shape so that the second sub-pixel 120 can have the same shape as the droplet of the light-emitting functional layer material, and the liquid light-emitting functional layer material does not need to be molded by further flowing so that the formed film of the light-emitting functional layer material has a better uniformity.

Figure 24:
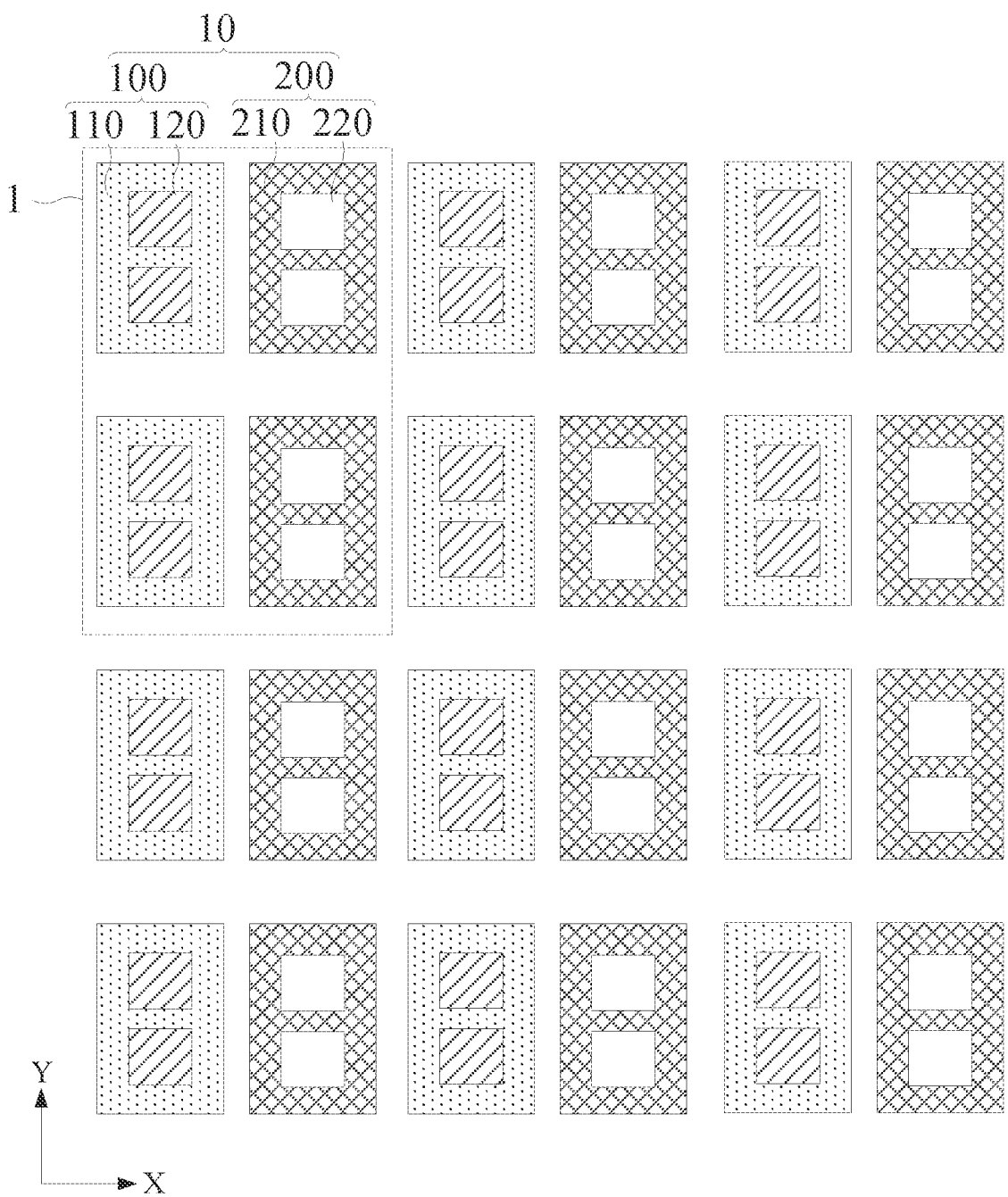
FIG. 24 is a schematic diagram of another pixel structure provided by an embodiment of the present disclosure.

FIG. 24 is a schematic diagram of another pixel structure provided by an embodiment of the present disclosure. As shown in FIG. 24, the pixel structure includes at least multiple first sub-pixel groups 100. Each of the multiple first sub-pixel groups 100 includes a first sub-pixel 110 and at least two second sub-pixels 120, and the at least two second sub-pixels 120 have different emission colors. The first sub-pixel 110 is disposed around the at least two second sub-pixels 120, and an emission color of the first sub-pixel 110 is different from an emission color of any one of the at least two second sub-pixels 120. In an embodiment, the pixel structure further includes multiple second sub-pixel groups 200. Each of the multiple second sub-pixel groups 200 includes a fourth sub-pixel 210 and at least two fifth sub-pixels 220, the fourth sub-pixel 210 is disposed around the at least two fifth sub-pixels 220, an emission color of the fourth sub-pixel 210 is different from an emission color of any one of the at least two fifth sub-pixels 220; and in a first direction X, a first sub-pixel group 100 and a second sub-pixel group 200 adjacent to the first sub-pixel group 100 constitute a pixel unit 10, and multiple pixel units 10 are arranged in an array.

In this embodiment, such arrangement enables the emission colors of the sub-pixels included in the pixel structure to be more abundant and the sub-pixels of different colors to be arranged more compact, which facilitates the improvement of the display effect of the display device.

Exemplarily, the at least two fifth sub-pixels 220 may have a same emission color.

Exemplarily, the at least two fifth sub-pixels 220 may also have different emission colors.

In an embodiment, the first sub-pixel group 100 may include two second sub-pixels 120 of different emission colors, the second sub-pixel group 200 may include two fifth sub-pixels 220 of different emission colors, and the pixel unit 10 may include sub-pixels of four colors.

Exemplarily, the four colors may be selected from red, green, blue and any one of white or yellow.

Colors of the first sub-pixel 110, each second sub-pixel 120, the fourth sub-pixel 210, and each fifth sub-pixel 220 are not limited by this embodiment and any solution satisfying the above color arrangement is within the protection scope of this embodiment.

In an embodiment, referring to FIG. 24, two adjacent pixel units 10 constitute a pixel unit group 1 in a direction Y vertical to the first direction X, and the two pixel units 10 in the same pixel unit group 1 have a same structure.

Figure 25:
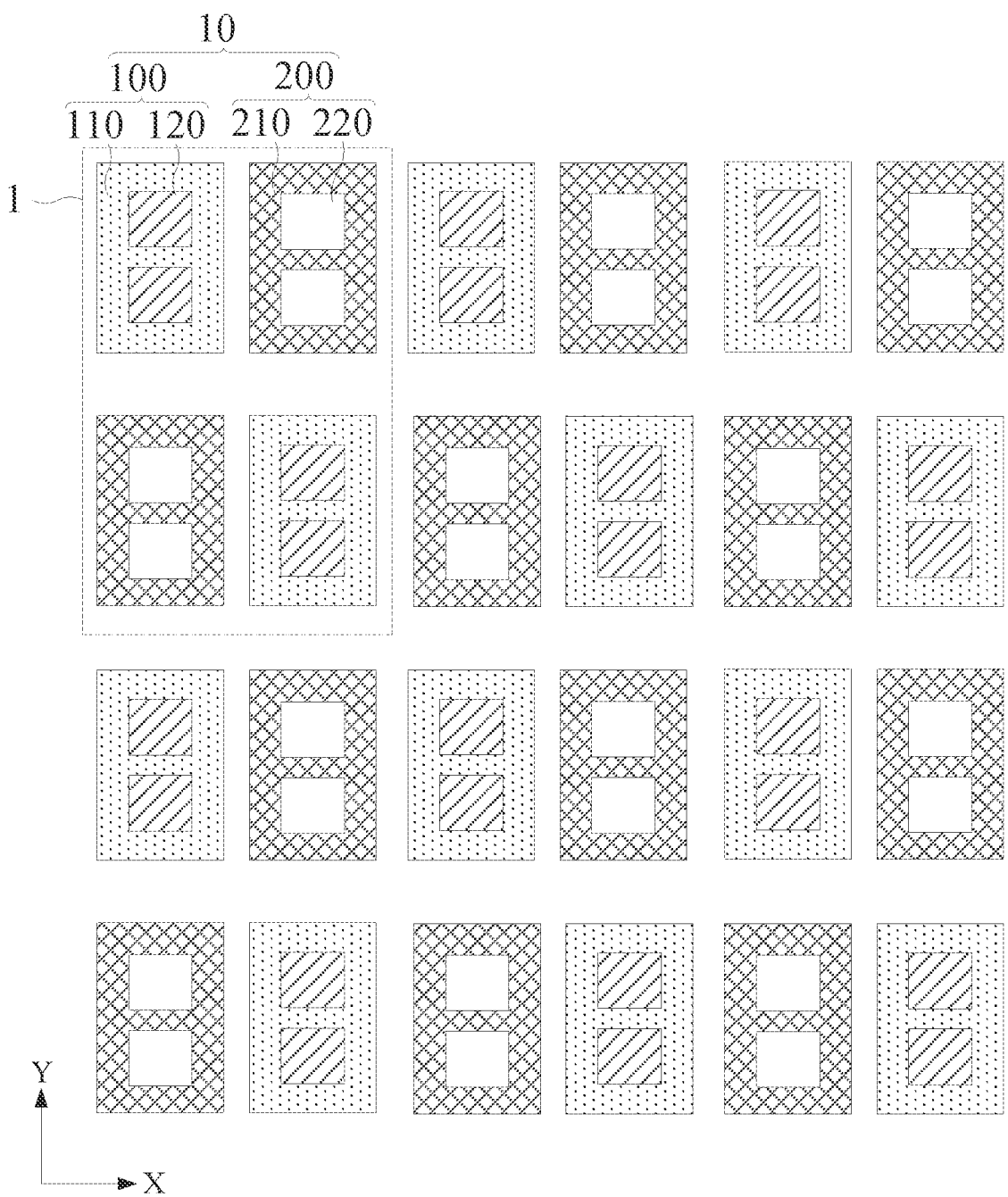
FIG. 25 is a schematic diagram of another pixel structure provided by an embodiment of the present disclosure.

FIG. 25 is a schematic diagram of another pixel structure provided by an embodiment of the present disclosure. The pixel structure shown in FIG. 25 is similar to the pixel structure shown in FIG. 24 except that arrangement orders of a first sub-pixel group 100 and a second sub-pixel group 200 in two pixel units 10 in a same pixel unit group 1 in a first direction X are different.

In this embodiment, the pixel unit group 1 is a minimum repeating unit in the pixel structure, and multiple pixel unit groups 1 are repeatedly arranged to constitute the pixel structure.

In an embodiment, as shown in FIG. 25, the arrangement orders being different refers to that the first sub-pixel group 100 and the second sub-pixel group 200 in one pixel unit 10 in the pixel unit group 1 are sequentially arranged in the first direction X, and the second sub-pixel group 200 and the first sub-pixel group 100 in another pixel unit 10 in the pixel unit group 1 are sequentially arranged in the first direction X. That is, the first sub-pixel groups 100 in the two pixel units 10 in the same pixel unit group 1 have an identical structure, the second sub-pixel groups 200 in the two pixel units 10 in the same pixel unit group 1 also have an identical structure, and only the arrangement orders of the first sub-pixel group and the second sub-pixel group are different.

Such structure shown in FIG. 25 prevents sub-pixels of a same color from being arranged adjacently in the first direction X or a direction Y vertical to the first direction X, thereby reducing the probability of the occurrence of bright lines and facilitating improving the display effect of the display device.

Figure 26:
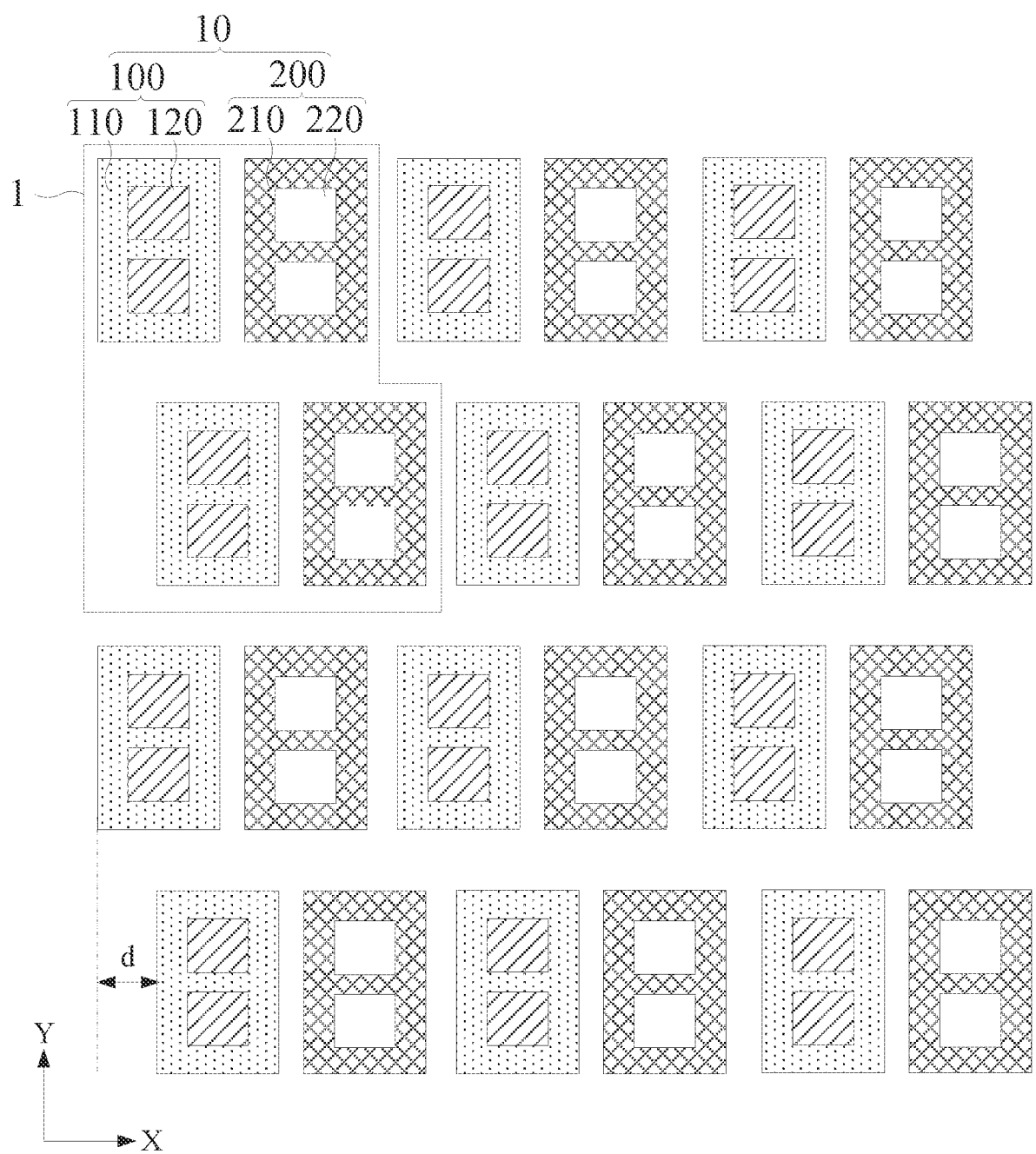
FIG. 26 is a schematic diagram of another pixel structure provided by an embodiment of the present disclosure.
Figure 27:
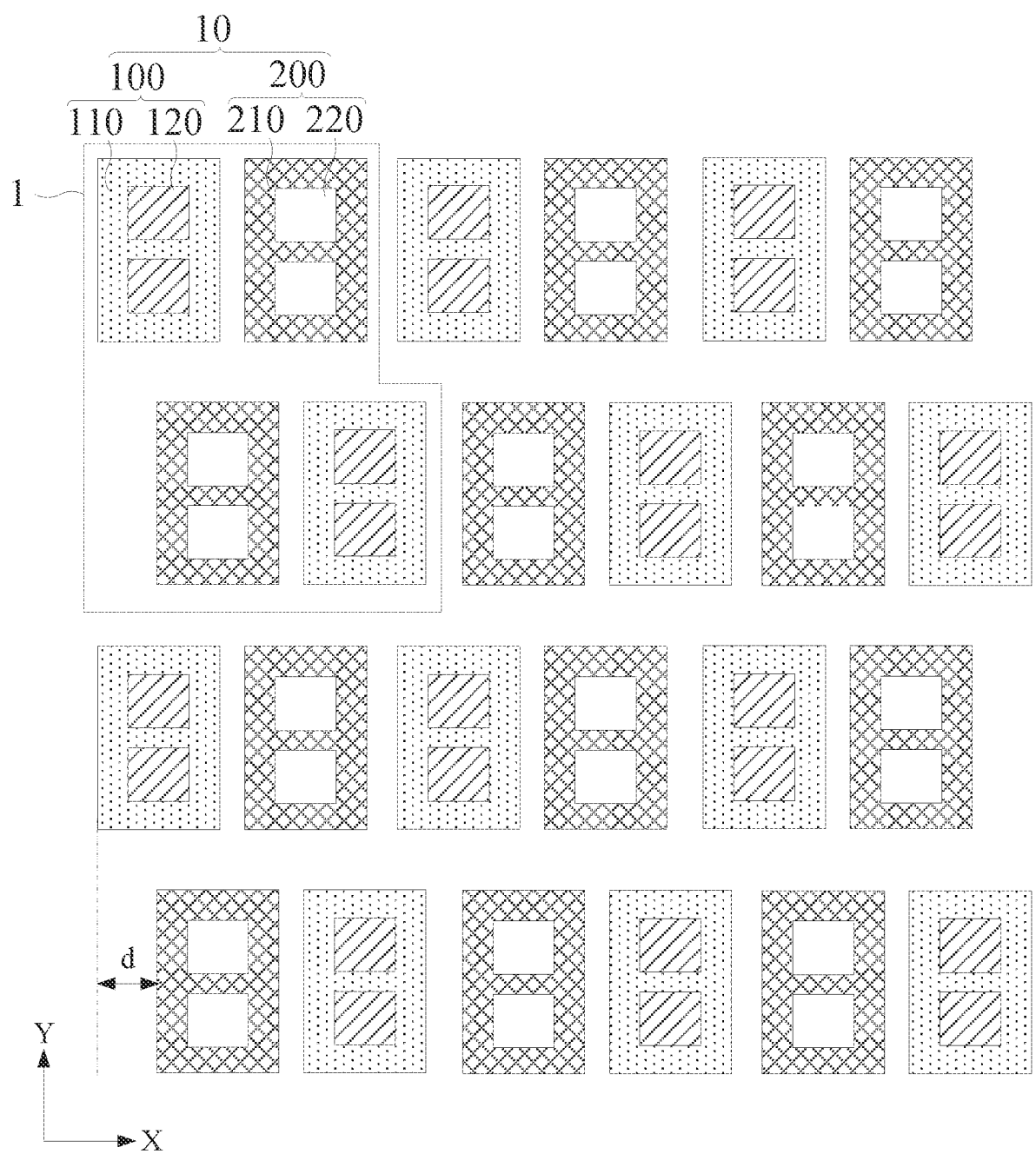
FIG. 27 is a schematic diagram of another pixel structure provided by an embodiment of the present disclosure.

FIG. 26 is a schematic diagram of another pixel structure provided by an embodiment of the present disclosure. FIG. 27 is a schematic diagram of another pixel structure provided by an embodiment of the present disclosure. The pixel structure shown in FIG. 26 is similar to the pixel structure shown in FIG. 24, and the pixel structure shown in FIG. 27 is similar to the pixel structure shown in FIG. 25 except that in FIGS. 26 and 27, two pixel units 10 in a same pixel unit group 1 are misaligned in a first direction X and a misalignment width d is less than a width of a first sub-pixel group 100.

In this embodiment, the misalignment width d refers to a distance between geometric centers of the two pixel units 10 in the same pixel unit group 1 in the first direction X, and the width of the first sub-pixel group 100 refers to a length of the first sub-pixel group 100 in the first direction X.

In this embodiment, such arrangement enables sub-pixels of different emission colors to be more compactly arranged, which facilitates color mixture of light of different colors emitted by multiple sub-pixels and further improves the display effect of the display device.

Exemplarily, as shown in FIGS. 20, 21, 26 and 27, the misalignment width d may be equal to a half of the width of the first sub-pixel group 100.

Experiments showed that in a case where the misalignment width d is equal to a half of the width of the first sub-pixel group 100, sub-pixels of four different colors in the pixel unit 10 have the highest compactness and the best color mixing effect, thereby enabling the display device to have a better display effect.

Figure 28:
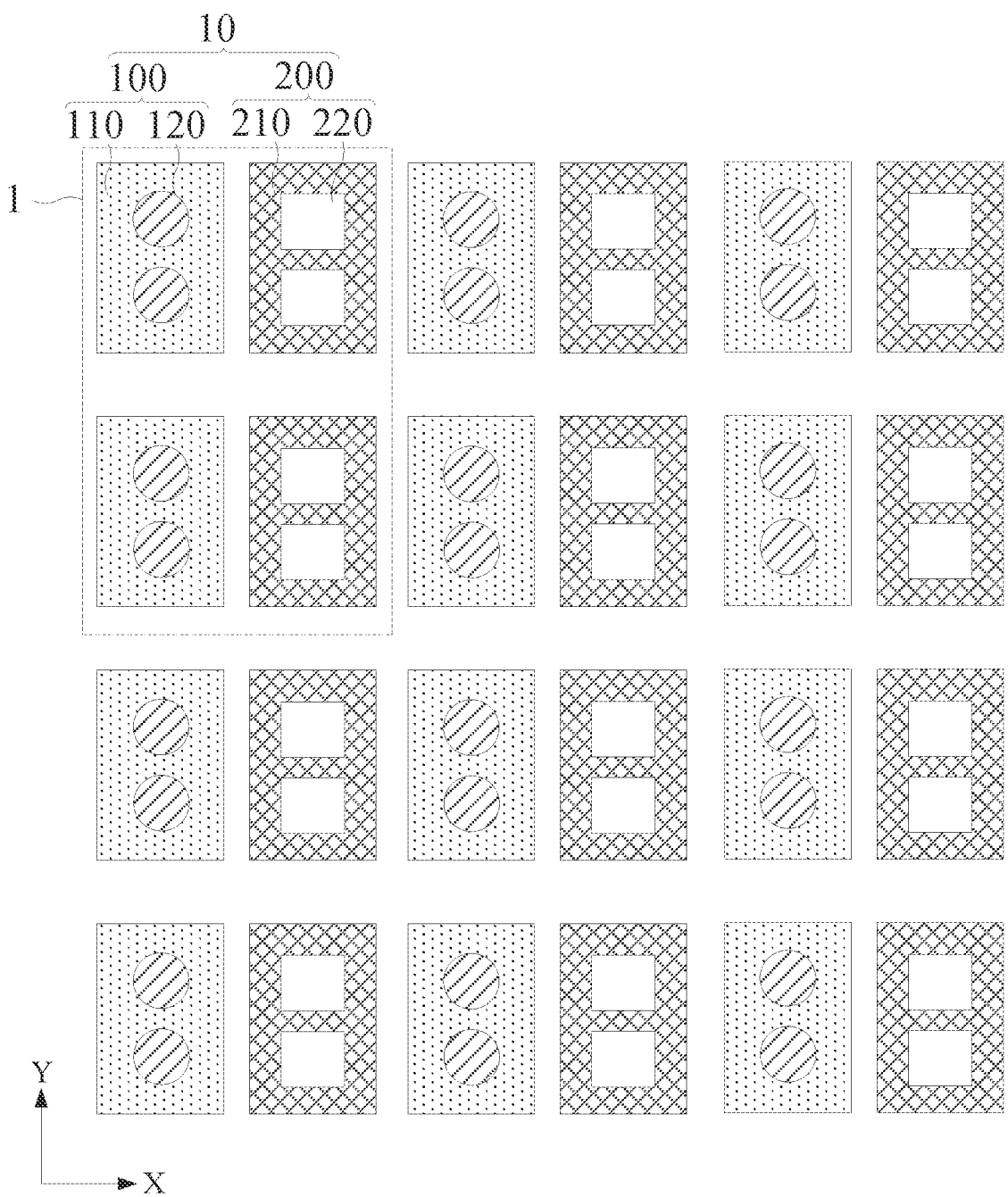
FIG. 28 is a schematic diagram of another pixel structure provided by an embodiment of the present disclosure.
Figure 29:
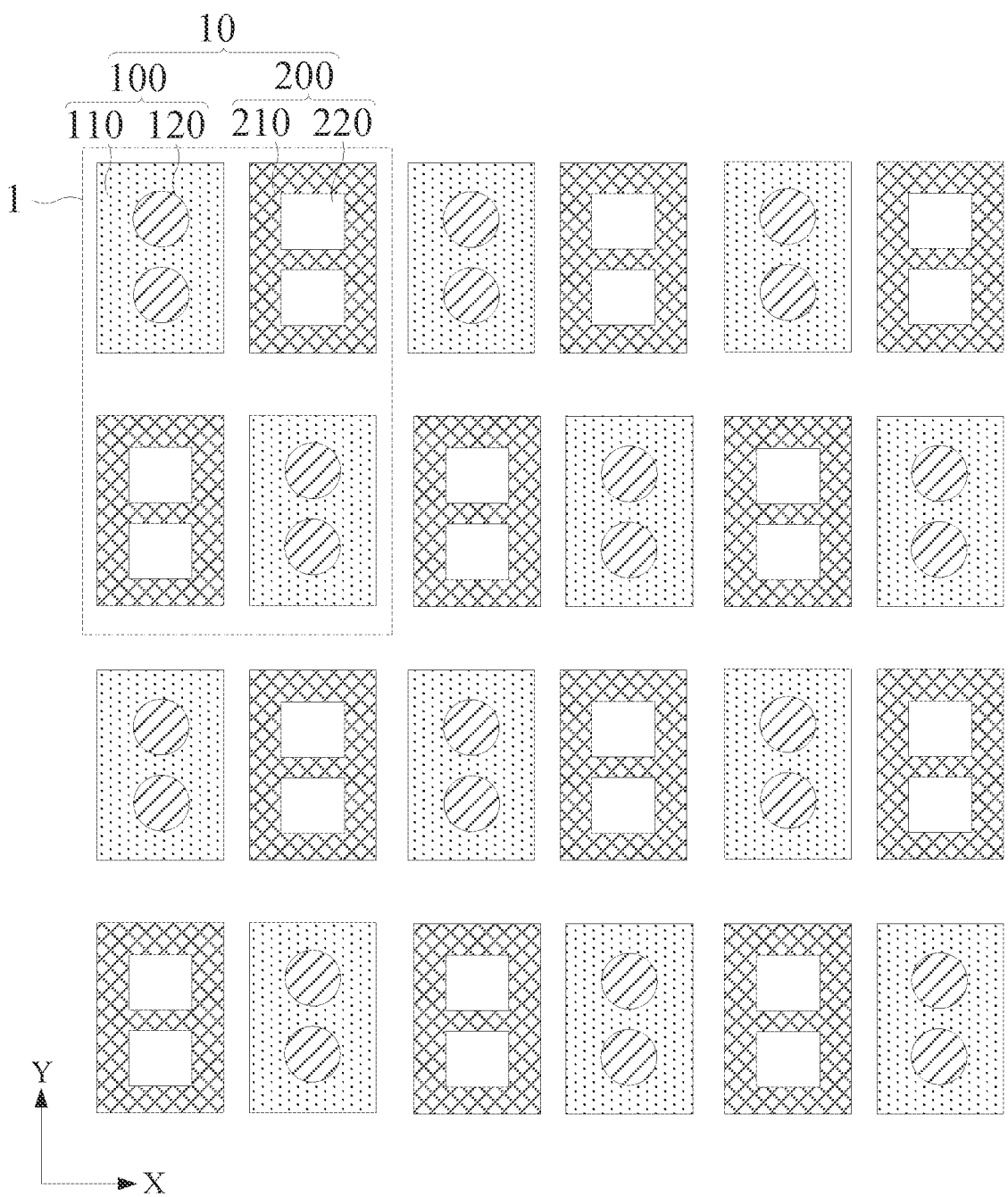
FIG. 29 is a schematic diagram of another pixel structure provided by an embodiment of the present disclosure.

FIG. 28 is a schematic diagram of another pixel structure provided by an embodiment of the present disclosure. FIG. 29 is a schematic diagram of another pixel structure provided by an embodiment of the present disclosure. The pixel structure shown in FIG. 28 is similar to the pixel structure shown in FIG. 24, and the pixel structure shown in FIG. 29 is similar to the pixel structure shown in FIG. 25 except that in FIGS. 28 to 29, second sub-pixels 120 are circular in shape.

In this embodiment, such arrangement enables the second sub-pixel 120 to have the same shape as a droplet of the light-emitting functional layer material when the light-emitting functional layer material of the sub-pixel is formed by using an inkjet printing technology, and thus the formed film light-emitting functional layer material has a better uniformity, referring to the preceding related contents for details, which will not be repeated herein.

Figure 30:
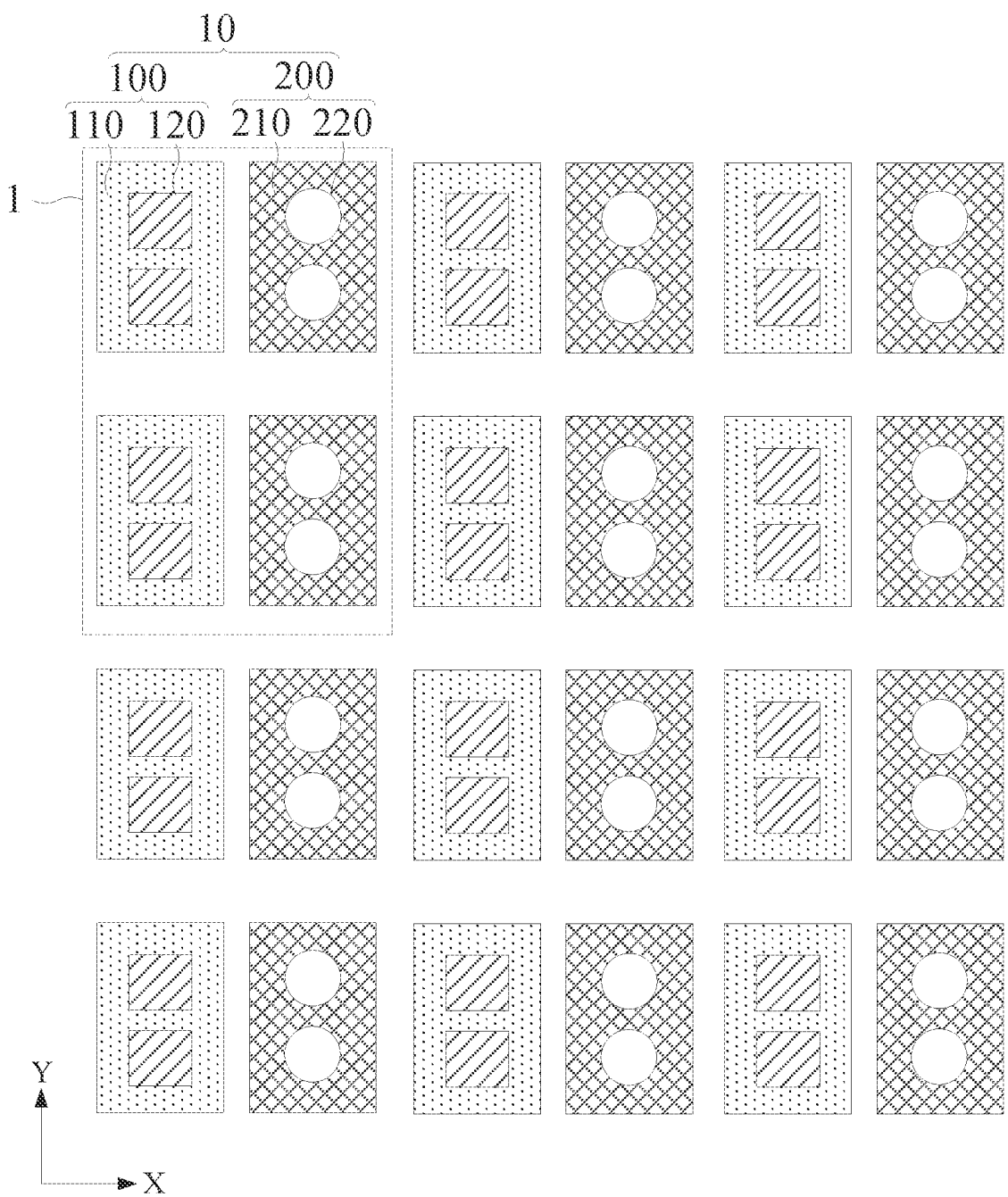
FIG. 30 is a schematic diagram of another pixel structure provided by an embodiment of the present disclosure.
Figure 31:
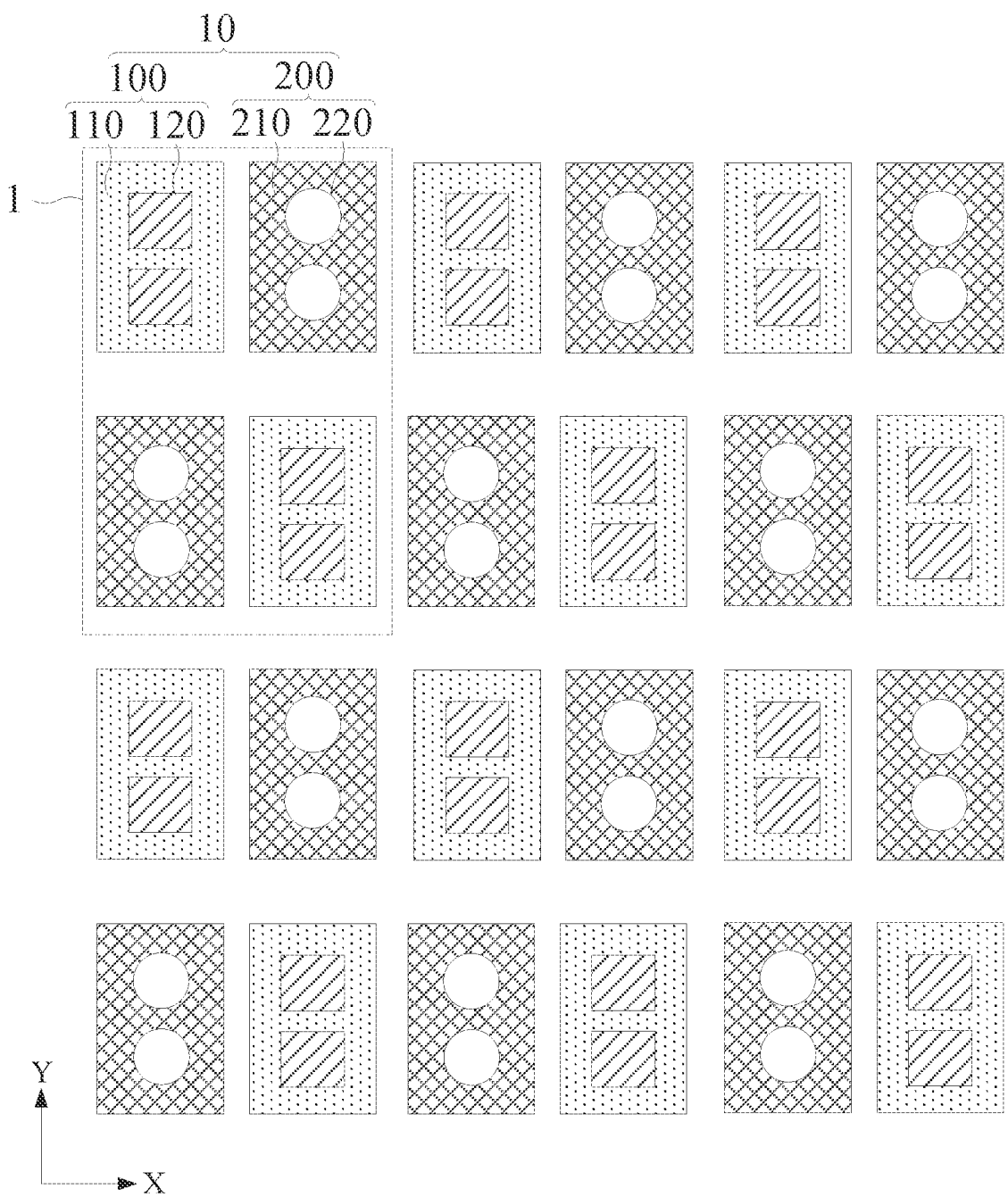
FIG. 31 is a schematic diagram of another pixel structure provided by an embodiment of the present disclosure.

FIG. 30 is a schematic diagram of another pixel structure provided by an embodiment of the present disclosure. FIG. 31 is a schematic diagram of another pixel structure provided by an embodiment of the present disclosure. The pixel structure shown in FIG. 30 is similar to the pixel structure shown in FIG. 24, and the pixel structure shown in FIG. 31 is similar to the pixel structure shown in FIG. 25 except that in FIGS. 30 to 31, fifth sub-pixels 220 are circular in shape.

In this embodiment, such arrangement enables the fifth sub-pixel 220 to have a same shape as a droplet of the light-emitting functional layer material when the light-emitting functional layer material of the sub-pixel is formed by using an inkjet printing technology, and thus the formed film of the light-emitting functional layer material has a better uniformity, referring to the preceding related contents for details, which will not be repeated herein.

Figure 32:
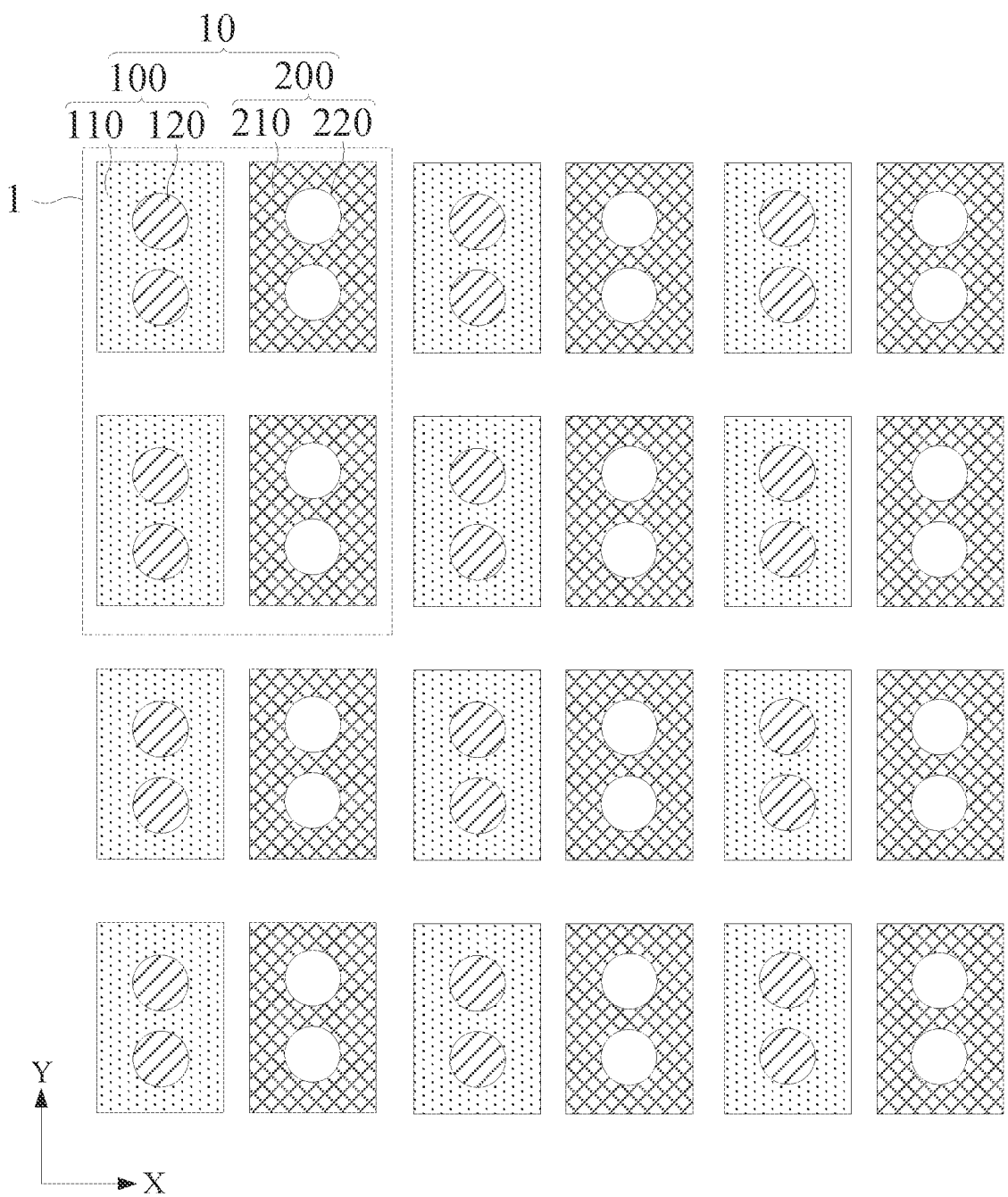
FIG. 32 is a schematic diagram of another pixel structure provided by an embodiment of the present disclosure.
Figure 33:
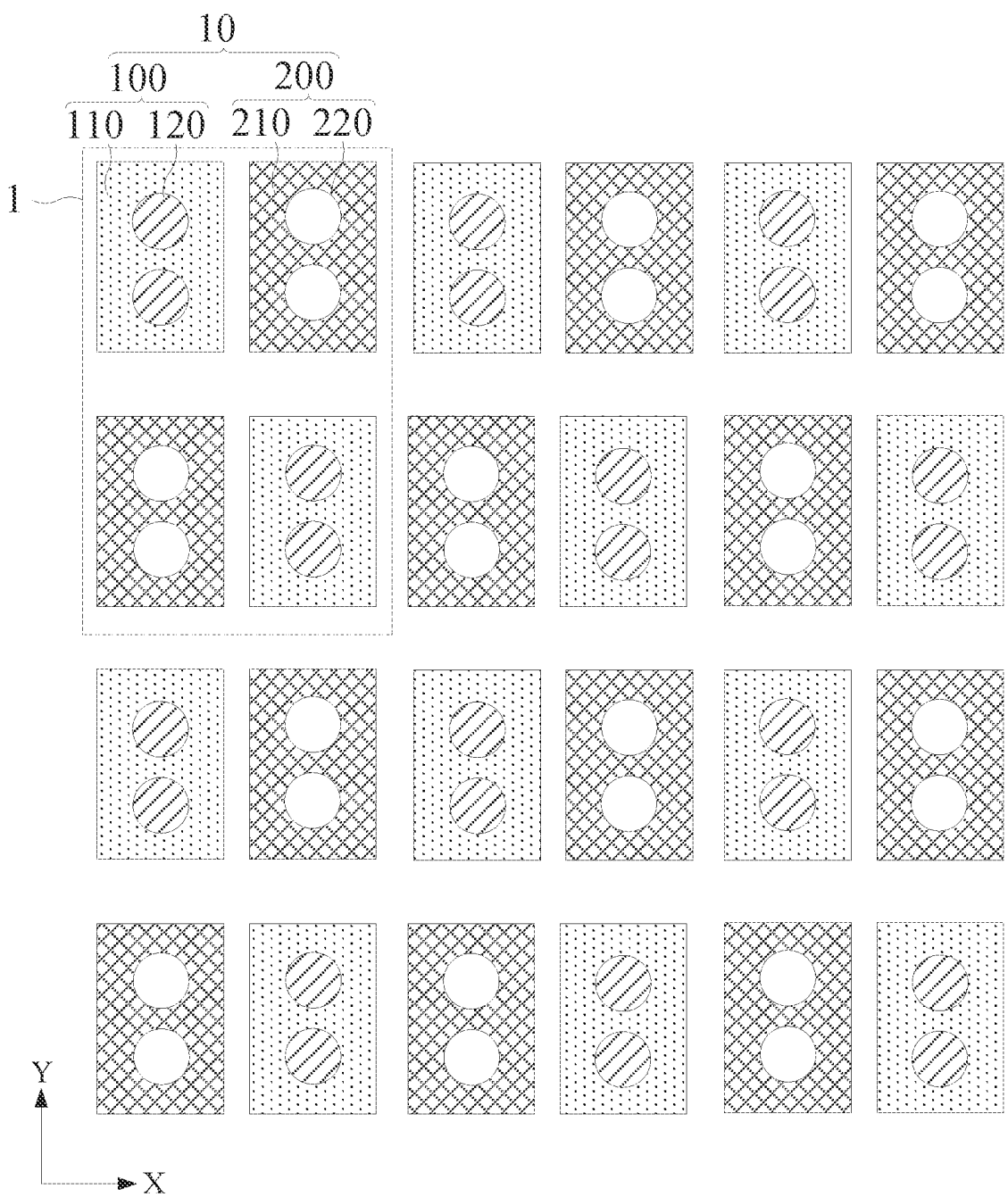
FIG. 33 is a schematic diagram of another pixel structure provided by an embodiment of the present disclosure.

FIG. 32 is a schematic diagram of another pixel structure provided by an embodiment of the present disclosure. FIG. 33 is a schematic diagram of another pixel structure provided by an embodiment of the present disclosure. The pixel structure shown in FIG. 32 is similar to the pixel structure shown in FIG. 24, and the pixel structure shown in FIG. 33 is similar to the pixel structure shown in FIG. 25 except that in FIGS. 32 to 33, second sub-pixels 120 and fifth sub-pixels 220 are all circular in shape.

In this embodiment, such arrangement enables the second sub-pixel 120 and the fifth sub-pixel 220 to have the same shape as a droplet of the light-emitting functional layer material when the light-emitting functional layer material of the sub-pixel is formed by using an inkjet printing technology, and thus the formed film of the light-emitting functional layer material has a better uniformity, referring to the preceding related contents for details, which will not be repeated herein.

Figure 34:
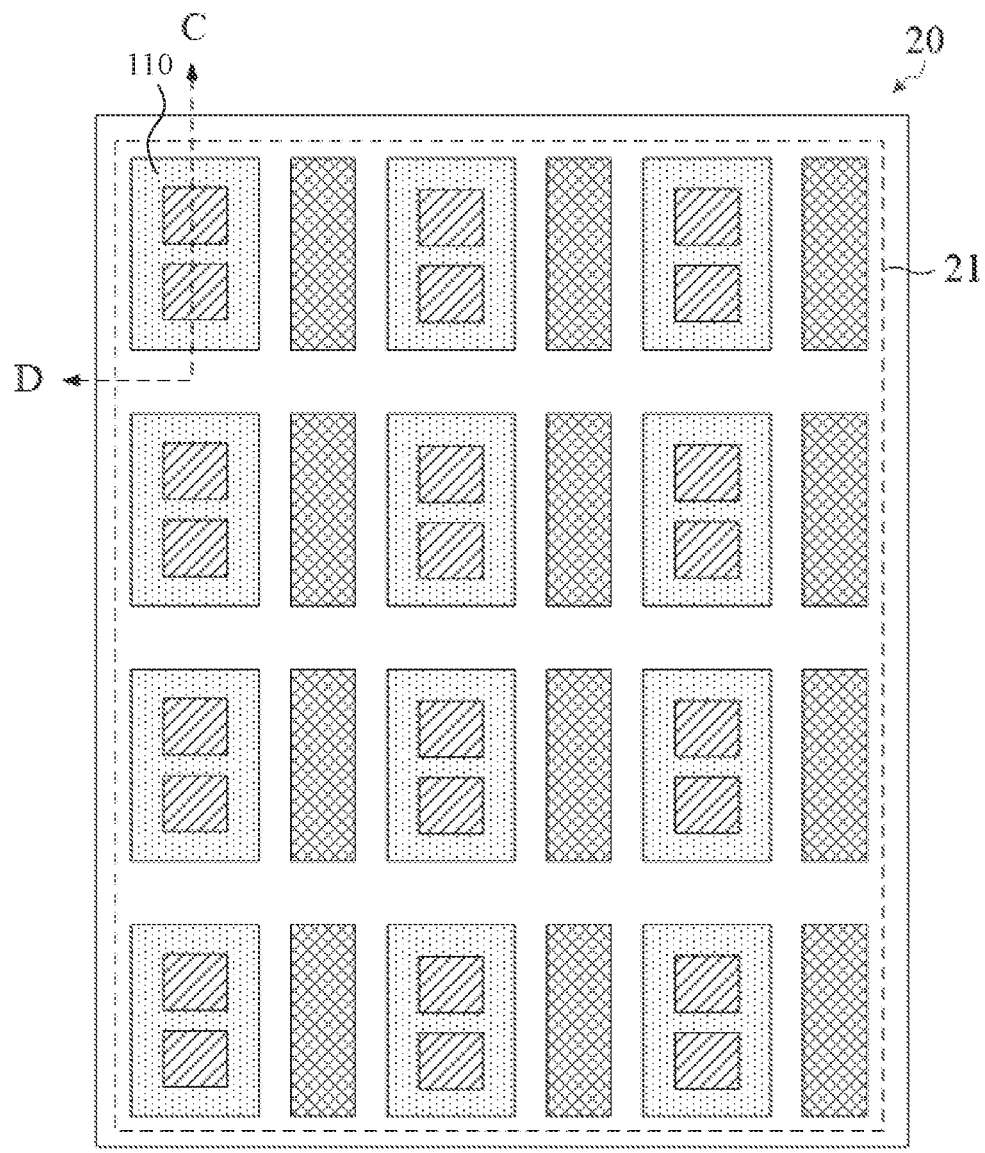
FIG. 34 is a structure diagram of a display panel provided by an embodiment of the present disclosure.

FIG. 34 is a structural diagram of a display panel provided by an embodiment of the present disclosure. As shown in FIG. 34, the display panel 20 includes the pixel structure 21 described in any embodiment of the present disclosure. Since the display panel provided by the present disclosure includes any pixel structure 21 provided by the embodiments of the present disclosure, the display panel has the same or corresponding beneficial effects as the pixel structure 21 included in the display panel, which will not be repeated herein.

Figure 35:
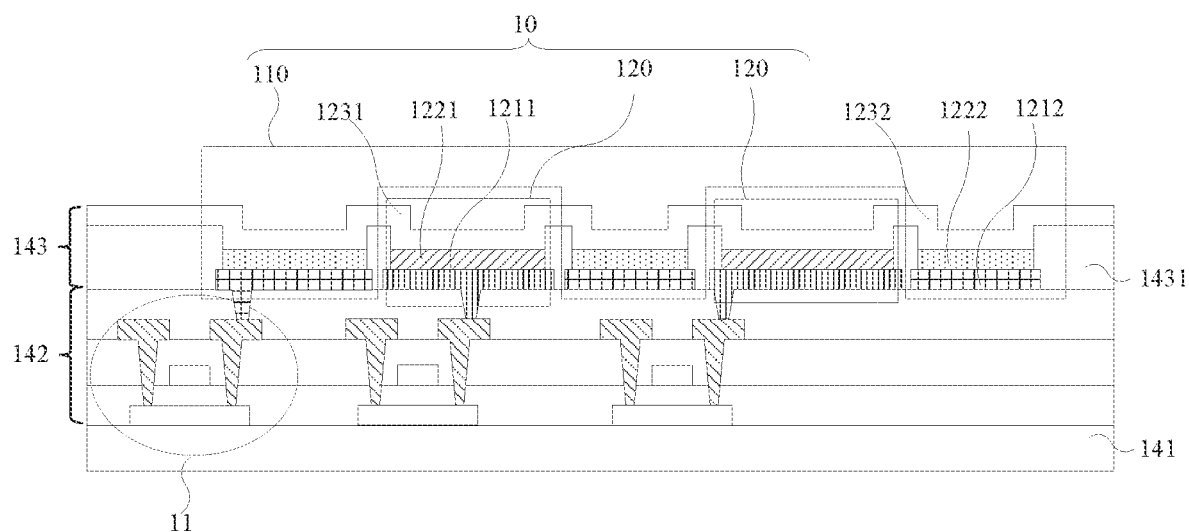
FIG. 35 is a sectional view taken along a dotted line CD in FIG. 34.

FIG. 35 is a sectional view taken along a dotted line CD in FIG. 34. As shown in FIG. 35, each second sub-pixel 120 includes a first electrode 1211, a light-emitting functional layer 1221 and a second electrode 1231 laminated sequentially in a light-emitting direction, and at least one second sub-pixel 120 in a same first sub-pixel group 10 shares a same first electrode 1211.

Referring to FIG. 35, the display panel includes a base substrate 141, and a drive circuit layer 142, a light-emitting device layer 143 and an encapsulation layer (not shown in FIG. 35) which are sequentially formed on the base substrate 141. The drive circuit layer 142 includes multiple drive circuits. To simplify drawings, in FIG. 35, only drive transistors 11 in the drive circuits are illustrated exemplarily, and each drive circuit is configured to drive one sub-pixel to emit light. Moreover, the light-emitting device layer 143 includes multiple sub-pixels and a pixel definition layer 1431 defining the multiple sub-pixels. In an embodiment, as shown in FIG. 35, the sub-pixels include a first sub-pixel 110 and a second sub-pixel 120, the first sub-pixel 110 includes a first A electrode 1212, a A light-emitting function layer 1222, and a second A electrode 1232 which are laminated sequentially in a light-emitting direction, the first A electrode 1212 of the first sub-pixel 110 and the first electrode 1211 of the second sub-pixel 120 are located in a same layer, and the A light-emitting function layer 1222 of the first sub-pixel 110 and a light-emitting function layer 1221 of the second sub-pixel 120 are located in a same layer. In FIG. 35, the first A electrode 1212 of the first sub-pixel 110 and the first electrode 1211 of the second sub-pixel 120, and the A light-emitting function layer 1222 of the first sub-pixel 110 and the light-emitting function layer 1221 of the second sub-pixel 120 are distinguished by different filling shadows. In an embodiment, both the first A electrode 1212 and the A light-emitting function layer 1222 of the first sub-pixel 110 are an integral structure, and the first A electrode 1212 and the A light-emitting functional layer 1222 have the same shape as the first sub-pixel 110 shown in FIG. 34.

Figure 36:
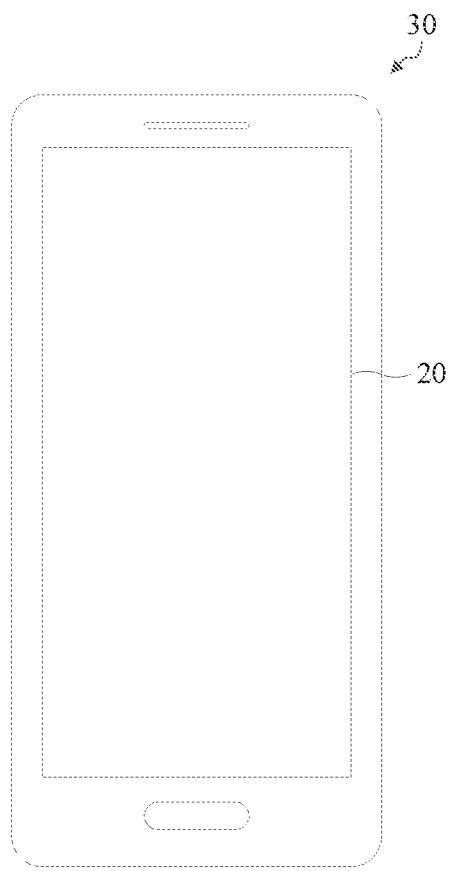
FIG. 36 is a structure diagram of a display device provided by an embodiment of the present disclosure.

FIG. 36 is a structural diagram of a display device provided by an embodiment of the present disclosure. As shown in FIG. 36, the display device 30 includes the display panel 20 described in any embodiment of the present disclosure. Since the display device 30 provided in the present disclosure includes any display panel 20 provided by the embodiments of the present disclosure, details are not repeated here.

What is claimed is:

1. A pixel structure, comprising:
a plurality of first sub-pixel groups, wherein each of the plurality of first sub-pixel groups comprises a first sub-pixel and at least two second sub-pixels, the at least two second sub-pixels have different emission colors, the first sub-pixel is disposed around the at least two second sub-pixels, an emission color of the first sub-pixel is different from an emission color of any one of the at least two second sub-pixels; and
a plurality of third sub-pixels,
wherein an emission color of each of the plurality of third sub-pixels is different from the emission color of the first sub-pixel; wherein in a first direction, one of the plurality of first sub-pixel groups and one of the plurality of third sub-pixels adjacent to the one of the plurality of first sub-pixel groups constitute a pixel unit, and a plurality of pixel units are arranged in an array;
wherein in a direction vertical to the first direction, two adjacent ones of the plurality of pixel units constitute a pixel unit group; and wherein two pixel units in a same pixel unit group have a same structure, or arrangement orders of a first sub-pixel group and a third sub-pixel in two pixel units in a same pixel unit group in the first direction are different;
wherein the pixel unit group is a minimum repeating unit in the pixel structure.

2. The pixel structure of claim 1, wherein each of the plurality of first sub-pixel groups comprises two second sub-pixels and each of the plurality of pixel units comprises sub-pixels of four emission colors.

3. The pixel structure of claim 2, wherein the four emission colors are selected from red, green, blue and one of white or yellow.

4. The pixel structure of claim 1, wherein each of the at least two second sub-pixels is circular in shape.

5. The pixel structure of claim 1, wherein in the first direction, the two pixel units in the same pixel unit group are misaligned, and a misalignment width is less than a width of the first sub-pixel group.

6. The pixel structure of claim 5, wherein the misalignment width is a half of the width of the first sub-pixel group.

7. A display panel, comprising the pixel structure of claim 1.

8. The display panel of claim 7, wherein each of the at least two second sub-pixels comprises a first electrode, a light-emitting functional layer and a second electrode laminated sequentially in a light-emitting direction, and the at least two second sub-pixels in a same first sub-pixel group share a same first electrode.

9. A display device, comprising the display panel of claim 7.

* * * * *